(12) United States Patent
Walker et al.

(10) Patent No.: US 7,110,169 B1
(45) Date of Patent: Sep. 19, 2006

(54) INTEGRATED OPTICAL DEVICE INCLUDING A VERTICAL LASING SEMICONDUCTOR OPTICAL AMPLIFIER

(75) Inventors: Jeffrey D. Walker, El Cerrito, CA (US); Sol P. DiJaili, Moraga, CA (US)

(73) Assignee: Finisar Corporation, Sunnyvale, CA (US)

( * ) Notice: Subject to any disclaimer, the term of this patent is extended or adjusted under 35 U.S.C. 154(b) by 196 days.

(21) Appl. No.: 10/014,679

(22) Filed: Dec. 11, 2001

Related U.S. Application Data
(60) Provisional application No. 60/255,753, filed on Dec. 14, 2000.

(51) Int. Cl.
*H01S 3/00* (2006.01)

(52) U.S. Cl. .................... 359/344; 359/337
(58) Field of Classification Search ............ 385/14; 359/344
See application file for complete search history.

(56) References Cited

U.S. PATENT DOCUMENTS

| | | | | |
|---|---|---|---|---|
| 3,467,906 A | | 9/1969 | Cornely et al. ............ 330/4.3 |
| 3,828,231 A | | 8/1974 | Yamamoto ................. 357/30 |
| 4,794,346 A | | 12/1988 | Miller ....................... 330/4.3 |
| 5,436,759 A | | 7/1995 | Dijaili et al. .............. 359/333 |
| 5,949,807 A | | 9/1999 | Fujimoto et al. .......... 372/45 |
| 5,960,024 A | | 9/1999 | Li et al. ..................... 372/96 |
| 6,044,100 A | | 3/2000 | Hobson et al. ............ 372/46 |
| 6,115,517 A | | 9/2000 | Shiragaki et al. .......... 385/24 |
| 6,647,041 B1 | * | 11/2003 | Verma et al. ............... 372/45 |
| 6,690,845 B1 | * | 2/2004 | Yoshimura et al. ........ 385/14 |

FOREIGN PATENT DOCUMENTS

| | | |
|---|---|---|
| JP | 56006492 | 1/1981 |
| JP | 01129483 | 11/1987 |
| JP | 10190147 | 7/1998 |

OTHER PUBLICATIONS

Alcatel, "Alcatel Optronics introduces a Gain–Clamped Semiconductor Optical Amplifier," *Press Release for Immediate Publication*, OFC '98, San Jose (Feb. 1998), i unnumbered page.

Bauer, B. et al., "Gain Stabilization of a Semiconductor Optical Amplifier by Distributed Feedback," *IEEE Photonics Technology Letters*, vol. 6, No. 2 (Feb. 1994), pp. 182–185.

Dorgeuille, F., et al., "1.28 Tbit/s Throughput 8×8 Optical Switch Based on Arrays of Gain–clamped Semiconductor Optical Amplifier Gates," Optical Fiber Communication Conference, vol. 4, pp. 221–223, Mar. 2000.

Dorgeuille, F., et al., H., "Fast Optical Amplifier Gate Array for WDM Routing and Switching Applications," OFC '98 Technical Digest, pp. 42–44, 1998.

Doussiere, P. et al., "Clamped Gain Travelling Wave Semiconductor Optical Amplifier for Wavelength Division Multiplexing Applications," Maui, Hawaii, Sep. 19–23, 1994, New York, IEEE, US, vol. Conf. 14 (Sep. 14, 1994), pp. 185–186.

(Continued)

*Primary Examiner*—Mark Hellner
(74) *Attorney, Agent, or Firm*—Workman Nydegger

(57) ABSTRACT

An intergrated optical device comprises a vertically lasing semiconductor optical amplifier (VLSOA) and an optical element integrated onto a common substrate. Example optical elements include waveguides, unguided transparent regions, and active optical devices (including additional VLSOAs). The integrated device may be fabricated using a number of different methods, including based on selective area epitaxy, impurity induced disordering, etch and fill and silicon optical bench.

33 Claims, 28 Drawing Sheets

OTHER PUBLICATIONS

Evankow, Jr., J.D., et al., "Photonic Switching Modules Designed with Laser Diode Amplifiers," Journal on Selected Areas in Communications, vol. 6, No. 7, pp. 1087–1095, Aug. 1988.

Gee, S. et al., "High–Power Mode–locked External Cavity Semiconductor Laser Using Inverse Bow–Tie Semiconductor Optical Amplifiers," *IEEE Journal of Selected Topics in Quantum Electronics*, vol. 4, No. 2, Mar./Apr. 1998, pp. 209–215.

Jeong, G., et al., "Gain Optimization in Switches Based on Semiconductor Optical Amplifiers," Journal of Lightwave Technology, Vo. 13, No. 4, pp. 598–605, Apr. 1995.

Joyner, C.H. et al., "Extremely Large Band Gap Shifts for MQW Structures by Selective Epitaxy on SiO2 Masked Substrates," *IEEE Photonics Technology Letters*, vol. 4, No. 9 (Sep. 1992), pp. 1006–1009.

Kitamura, S., et al., "Spot–size Converter Integrated Semiconductor Optical Amplifiers for Otical Gate Applications," IEEE Journal of Quantum Electronics, vol. 35, No. 7, pp. 1067–1074, Jul. 1999.

Koyama, F., et al., "Multiple–Quantum–Well GaInAs/GaInAsP Tapered Broad–Area Amplifiers with Monolithically Integrated Waveguide Lens for High–Power Applications," IEEE Photonics Technology Letters (Aug. 1993), vol. 5, No. 8, pp. 916–919.

Leuthold, J., et al., "All–Optical Space Switches with Gain and Principally Ideal Extinction Ratios," IEEE Journal of Quantum Electronics, vol. 34, No. 4, pp. 622–633, Apr. 1998.

McAdams, L.R. et al., "Linearizing High Performance Semiconductor Optical Amplifiers: Techniques and Performance," LEOS Presentation (1996), pp. 363–364.

Mutalik, V.G. et al., "Analog performance of 1310–nm gain–clamped semiconductor optical amplifiers," *OFC '97 Technical Digest*, Thursday Morning, 11:15 AM, pp. 266–267.

Simon, J.C. et al., "Travelling wave semiconductor optical amplifier with reduced nonlinear distortions," *Electronics Letters*, vol. 30, No. 1 (Jan. 6, 1994), pp. 49–50.

Soulage, G. et al., "Calmped Gain Travelling Wave Semiconductor Optical Amplifier as a Large Dynamic Range Optical Gate," Alcatel Alsthom Recherche, route de Nozay, 916460 Marcoussis, France, undated, 4 unnumbered pages.

Tai, C., et al., "Dynamic Range and Switching Speed Limitations of an N×N Optical Packet Switch Based on Low–Gain Semiconductor Optical Amplifiers," IEEE Journal of Lightwave Technology, vol. 14, No. 4, pp. 525–533, Apr. 4, 1996.

Tiemeijer, L.F. et al., "1310–nm DBR–Type MQW Gain–Clamped Semiconductor Optical Amplifiers with AM–CATV–Grade Linearity," *IEEE Photonics Technology Letters*, vol. 8, No. 11 (Nov. 1996), pp. 1453–1455.

Tiemeijer, L.F. et al., "High–gain 1310 nm Semiconductor Optical Amplifier Modules with a Built–in Amplified Signal Monitor for Optical Gain Control," *IEEE Photonics Technology Letters*, vol. 9, No. 3 (Mar. 1997), pp. 309–311.

Tiemeijer, L.F. et al., "Reduced Intermodulation Distortion in 1300 nm Gain–Clamped MQW Laser Amplifiers," *IEEE Photonics Technology Letters*, vol. 7, No. 3 (Mar. 1995), pp. 284–286.

Toptchiyski, G., et al., "Time–Domain Modeling of Semiconductor Optical Amplifiers for OTDM Applications," IEEE Journal of Lightwave Technology, vol. 17, No. 12, pp. 2577–2583, Dec. 1999.

van Roijen, R., et al.., "Over dB Gain from a Monolithically Integrated Optical Switch with an Amplifier," IEEE Photnics Technology Letters, vol. 5, No. 5, pp. 529–531, May 1993.

Walker, J.D. et al., "A Gain–Clamped, Crosstalk Free, Vertical Cavity Lasing Semiconductor Optical Amplifier for WDM Applications," summaries of the papers presnted at the topical meeting, Integrated Photonics Search; 1996 Technical Digest Series; Proceedings of Integrated Photonics; Boston, MA, USA, 29.04–02.05 1996, vol. 6, 1996, pp. 474–477.

* cited by examiner

INTEGRATED OPTICAL DEVICE INCLUDING A VERTICAL LASING SEMICONDUCTOR OPTICAL AMPLIFIER

CROSS-REFERENCE TO RELATED APPLICATION

This application claims priority under 35 U.S.C. § 119(e) to U.S. Provisional Pat. application Ser. No. 60/255,753, "Optical Devices Including a Semiconductor Optical Amplifier," by Jeffrey D. Walker, et al., filed Dec. 14, 2000. The subject matter of all of the foregoing are incorporated herein by reference.

BACKGROUND OF THE INVENTION

1. Field of the Invention

This invention relates generally to semiconductor optical amplifiers. More particularly, it relates to vertically lasing semiconductor optical amplifiers (VLSOAs) integrated with other optical elements on a common substrate and to methods for fabricating such integrated optical devices.

2. Description of the Related Art

Optical amplifiers, which boost the power of optical signals, are a basic building block for many types of optical systems. For example, fiber optic communications systems transmit information optically at very high speeds over optical fibers. A typical communications system includes a transmitter, an optical fiber, and a receiver. The transmitter incorporates information to be communicated into an optical signal and transmits the optical signal via the optical fiber to the receiver. The receiver recovers the original information from the received optical signal. In these systems, phenomena such as fiber losses, losses due to insertion of components in the transmission path, and splitting of the optical signal may attenuate the optical signal and degrade the corresponding signal-to-noise ratio as the optical signal propagates through the communications system. Optical amplifiers are used to compensate for these attenuations. As another example, receivers typically operate properly only within a relatively narrow range of optical signal power levels; optical amplifiers are used to boost an optical signal to the proper power range for the receiver.

Fiber amplifiers are one type of optical amplifier. They include a length of fiber which has been doped to form an active gain medium. Ions of rare-earth metals, such as erbium, are typically used as the dopant. The doped fiber is typically pumped by an optical pump at a wavelength which is preferentially absorbed by the ions but different from the wavelength of the optical signal to be amplified. The pumping results in a population inversion of electronic carriers in the active medium. Then, as the optical signal propagates through the doped fiber, it is amplified due to stimulated emission.

Semiconductor optical amplifiers (SOAs) are another type of optical amplifier. SOAs contain a semiconductor active region and an electrical current typically is used to pump the electronic population in the active region. An optical signal propagating through the active region experiences gain due to stimulated emission. Conventional SOAs are non-lasing and the gain in non-lasing SOAs typically depends on the amplitude of the optical signal. Thus, strong portions of the optical signal are amplified less than weak portions, resulting in distortion of the signal and also crosstalk between different optical signals propagating simultaneously through the amplifier. This significantly limits the use of conventional SOAs. In contrast, in lasing SOAS, the semiconductor active region is part of a laser cavity which is pumped above the lasing threshold. The gain is then clamped due to the lasing action and is fairly constant until the amplifier reaches its power limit.

Integrated optics is a term which is sometimes used to refer to the concept of an optical equivalent to electronic integrated circuits, in which many optical elements are integrated onto a common substrate. Current-day electronic circuits can implement very complex functionalities by combining a very large number of electronic elements in a single monolithic device. Electronic amplifiers are a basic building block of electronic integrated circuits. Current-day optical amplifiers, however, are not suited to play an analogous role with respect to integrated optics.

For example, fiber amplifiers are inherently too large to be useful in integrated optics. Common amplifiers used in the telecommunications industry are based on fibers which are tens of meters long. Fiber amplifiers also suffer from slow switching speeds and poor power efficiency. Furthermore, fiber amplifiers are currently manufactured using a process which is more reminiscent of electronic circuits made from hand soldered discrete components than today's highly automated semiconductor processes. As a result, not only is it difficult to produce large quantities of fiber amplifiers but the fiber amplifiers produced are fairly expensive.

SOAs also suffer from drawbacks which limit their usefulness in integrated optics. Conventional SOAs are typically packaged as discrete devices. The SOA is aligned to fiber pigtails, one for the SOA input and one for the SOA output, and the entire device is produced as a single package. This type of packaged device suffers from the same drawbacks as fiber amplifiers: large size and a labor-intensive manufacturing process.

Furthermore, in electronic integrated circuits, the various components are built up from a handful of basic building blocks: the transistor, the diode, interconnects, etc. This is not the case for optical integrated circuits. SOAs typically are very different in design from waveguides, sources, modulators, detectors, etc. The optical elements required to build up more complex systems typically are not based on a handful of common building blocks and often even require the use of different materials systems. For example, current-day fiber communications may require the use of a multi-wavelength transmitter. Such a transmitter typically uses InP based lasers, lithium niobate modulators, a dielectric thin film wavelength division multiplexer, and a glass fiber amplifier pumped by several GaAs based lasers. Note the difference in materials and structure. Integrating these devices onto a common substrate to form an integrated transmitter is not straightforward.

Even when conventional SOAs have been successfully integrated with other optical elements, they are limited to niche applications due to their crosstalk and other performance limitations. For example, irrespective of the integration problems, conventional SOAs generally are not suited to amplifying multi-wavelength data communication signals because the crosstalk between the different wavelength signals would unacceptably degrade the signals.

Thus, there is a need for an optical amplifier which can be easily integrated with other optical elements on a common substrate. There is further a need for methods for fabricating these integrated optical devices.

SUMMARY OF THE INVENTION

In accordance with the present invention, a integrated optical device comprises a vertically lasing semiconductor optical amplifier (VLSOA) and an optical element integrated onto a common substrate. The VLSOA includes a semiconductor active region. An amplifying path traverses the semiconductor active region. The VLSOA also includes a vertical laser cavity, which includes the semiconductor active region. Optical signals are amplified as they propagate along the amplifying path.

The optical element may be any number of structures. In one embodiment, the optical element includes a passive optical waveguide, for example a waveguide in which the core of the waveguide is coupled directly to the active region of the VLSOA. In another embodiment, the optical element includes an unguided transparent region positioned to optically couple the semiconductor active region with the unguided transparent region. In yet another embodiment, the optical element includes an active optical device, for example another VLSOA, a laser source, a modulator, or a photodetector. Other embodiments will be apparent.

In further accordance with the invention, a method for making such an integrated optical device includes forming the VLSOA on a substrate and forming the optical element on the substrate.

In one approach, the steps of forming the VLSOA and forming the optical element comprise using a common fabrication process on a common substrate, but with at least one parameter varying between the VLSOA and the optical element. For example, selective area epitaxy (SAE) and impurity induced disordering (IID) are two fabrication processes which may be used in this manner.

In one embodiment based on SAE, a nitride or oxide SAE mask is placed over selected areas of the substrate. Material is deposited on the masked substrate. The SAE mask results in a difference between the transition energy (e.g., the bandgap energy) of the material deposited on a first unmasked area of the substrate and the transition energy of the material deposited on a second unmasked area of the substrate. For example, the material deposited on the first unmasked area might form part of the active region of the VLSOA and the material deposited on the second unmasked area might form part of the core of a waveguide, with the difference in transition energy accounting for the different optical properties of the active region and the transparent core. SAE is particularly advantageous because it results in a smooth interface between optical elements and therefore reduces optical scattering at this interface, This, in turn, reduces both parasitic lasing modes and gain ripple. Furthermore, the SAE approach can be confined to only the minimum number of layers necessary (e.g., only the active region), thus minimizing the impact on the rest of the integrated device.

In one embodiment based on IID, an IID mask is placed over selected areas of the substrate. The masked substrate is bombarded with impurities, such as silicon or zinc, and subsequently annealed to cause disordering and intermixing of the materials in the bombarded region. The IID mask results in a difference between the transition energy of the material underlying a masked area of the substrate and the transition energy of the material underlying an unmasked area of the substrate. Continuing the previous example, the masked area might form part of the VLSOA active region and the unmasked area might form part of the core of a waveguide, with the difference in transition energy again accounting for the different optical properties.

In the previous SAE and IID examples, the difference in transition energy results in different optical properties between the VLSOA active region and a waveguide. Engineering the transition energy may also be used to fabricate many other types of integrated optical devices. For example, changing the transition energy between two VLSOAs can be used to optimize each VLSOA for a different wavelength region. In this way, the transition energy in a VLSOA could be graded in a controlled way to broaden, flatten, and shape the gain profile. Alternately, two different elements, such as a VLSOA and a laser source might require different transition energies for optimal performance. Other embodiments will be apparent.

In a different approach, the VLSOA and the optical element are formed on the common substrate but using different fabrication processes. In one embodiment, a VLSOA is formed on the common substrate in part by depositing a first set of materials on the substrate. Next, the deposited material is removed from selected areas of the substrate, for example by an etching process. A second set of materials is deposited in the selected areas to form in part the optical element. Etch and fill is one process which follows this approach. Continuing the VLSOA and waveguide example from above, materials are deposited to form the VLSOA (or at least a portion of the VLSOA). In the areas where the waveguide is to be located, these materials are removed and additional materials are deposited to form the waveguide (or at least a portion of it).

In yet another approach, the VLSOA and the optical element are formed on separate substrates by separate fabrication processes and integrated onto the common substrate. Planar lightwave circuitry and silicon optical bench are two examples of processes following this approach. In one embodiment, the VLSOA is formed on a first substrate. The optical element is formed on a second substrate. The VLSOA and the optical element are integrated onto a common substrate, which could be the first substrate, the second substrate or a completely different substrate.

The present invention is particularly advantageous because the integration of VLSOAs with other optical elements on a common substrate supports the building of integrated optical circuits. This, in turn, will accelerate the adoption and development of optical technologies.

BRIEF DESCRIPTION OF THE DRAWING

The invention has other advantages and features which will be more readily apparent from the following detailed description of the invention and the appended claims, when taken in conjunction with the accompanying drawing, in which:

DETAILED DESCRIPTION OF THE PREFERRED EMBODIMENTS

FIGS. 1A–4E are block diagrams of example integrated optical devices according to the present invention. Each example device includes a vertical lasing semiconductor optical amplifier (VLSOA) 110 and at least one other optical element integrated onto a common substrate. In some embodiments, the VLSOA and other optical element are optically coupled together on the integrated optical device, either directly or indirectly. For example, an output of the VLSOA may be coupled to an input of the optical element, the output of the optical element may be coupled to an input of the VLSOA, and/or the VLSOA and optical element may both be coupled to a common third optical element. In other embodiments, the VLSOA and other optical elements are integrated on a common substrate but they are not optically coupled to each other. For example, the integrated optical device might be a linear array of VLSOAs, with the inputs and outputs of the VLSOAs serving as inputs and outputs to the integrated device.

The optical element in each of the optical devices can be any number of known structures. Examples of "passive" optical elements include waveguides, splitters, combiners, couplers, vertical waveguide couplers, waveguide crossing intersections, unguided regions (i.e., the planar equivalent of free space regions), variable or fixed optical attenuators, loss gratings, saturable absorbers, window structures and mode converters, delay lines, cleaved or etched facets, etched gratings, etched tilted mirrors, Faraday isolators or other optical isolators, quarter wave plates and polarization rotating elements, photonic bandgap filters, thin film filters, arrayed waveguide gratings (AWG), channel dropping filters, wavelength locking filters, and other wavelength selectable gratings.

Examples of "active" optical elements include additional VLSOAs, other types of optical amplifiers such as non-lasing semiconductor optical amplifiers or longitudinally lasing semiconductor optical amplifiers, transverse lasing semiconductor optical amplifiers, wavelength converters, Mach Zender and other types of interferometers, optical regenerators (including both 2R and 3R regenerators), bistable devices, first order and higher order distributed Bragg gratings, phase shift regions, tunable wavelength filters, distributed Bragg reflector (DBR) lasers and other optical sources, detectors, electroabsorption modulators and other types of modulators.

The terms "passive" and "active" are in quotations to indicate that these terms are for classification convenience only and not intended to imply that all "passive" optical elements can operate only in a passive mode or that all "active" optical elements can operate only in an active mode. In fact, many optical elements can be used both actively and passively and, for others, it is not exactly clear whether they should be classified as active or passive.

Figure 5:
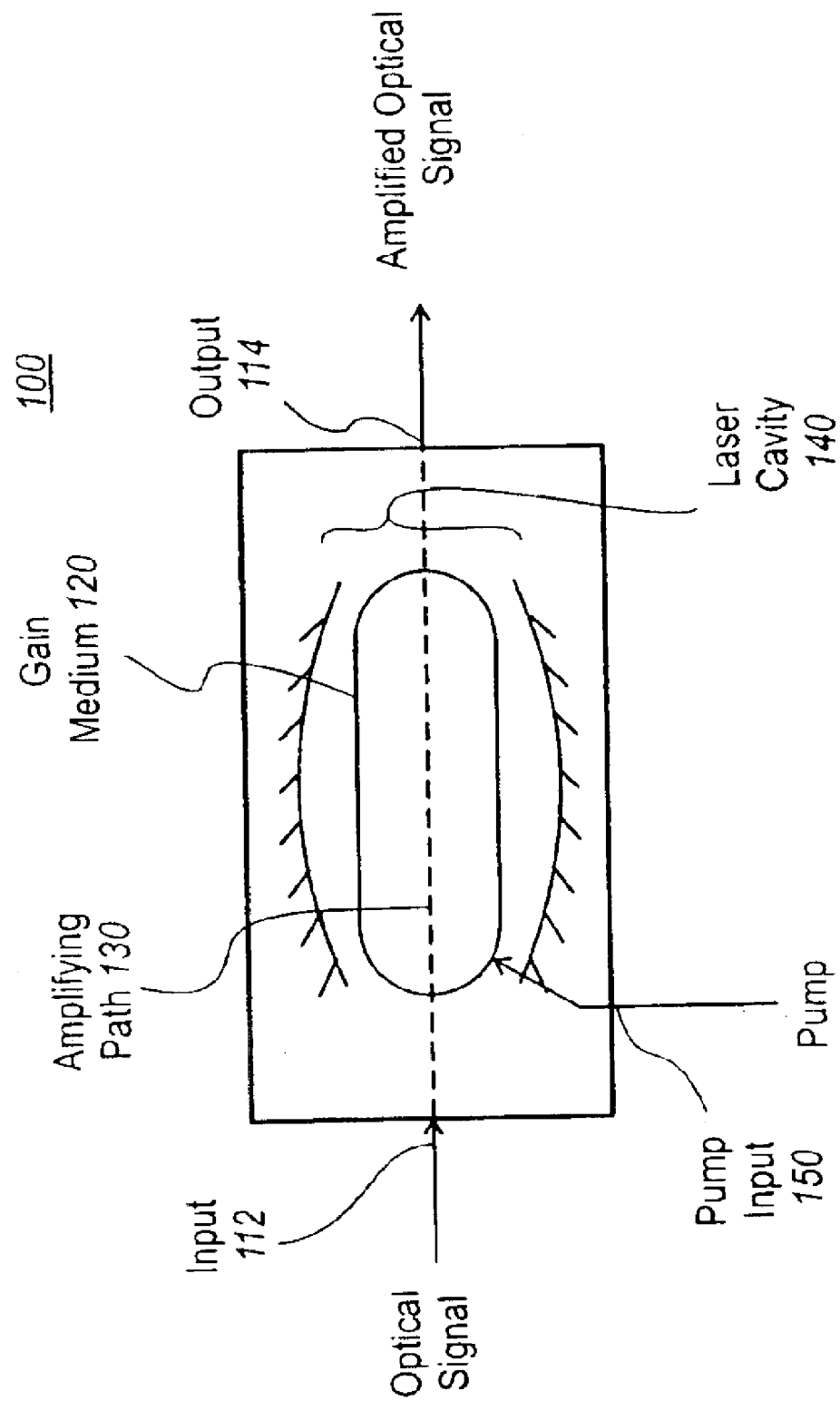
FIG. 5 is a diagram of a vertical lasing semiconductor optical amplifier (VLSOA) 110 in accordance with the present invention.

FIG. 5 is a diagram of a vertical lasing semiconductor optical amplifier (VLSOA) 110 in accordance with the present invention. The VLSOA 110 has an amplifier input 112 and an amplifier output 114. The VLSOA 110 further includes a semiconductor gain medium 120, with an amplifying path 130 coupled between the amplifier input 112 and the amplifier output 114 of the VLSOA 110 and traveling through the semiconductor gain medium 120. The VLSOA 110 further includes a laser cavity 140 including the semiconductor gain medium 120, and a pump input 150 coupled to the semiconductor gain medium 120. The laser cavity 140 is oriented vertically with respect to the amplifying path 130. The pump input 150 is for receiving a pump to pump the semiconductor gain medium 120 above a lasing threshold for the laser cavity 140.

Figure 13:
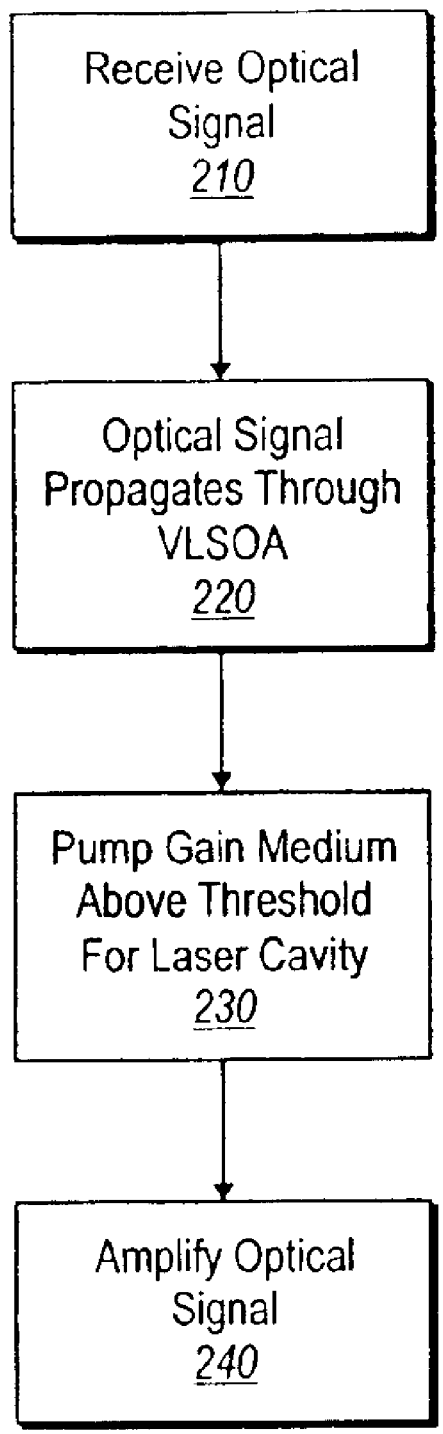
FIG. 13 is a flow diagram illustrating operation of VLSOA 110 when it is used as an amplifier.

FIG. 13 is a flow diagram illustrating operation of VLSOA 110 when it is used as an amplifier. The VLSOA 110 receives 210 an optical signal at its amplifier input 112. The optical signal propagates 220 along the amplifying path 130. The pump received at pump input 150 pumps 230 the semiconductor gain medium above a lasing threshold for the laser cavity 140. When lasing occurs, the round-trip gain offsets the round-trip losses for the laser cavity 140. In other words, the gain of the semiconductor gain medium 120 is clamped to the gain value necessary to offset the round-trip losses. The optical signal is amplified 240 according to this gain value as it propagates along the amplifying path 130 (i.e., through the semiconductor gain medium 120). The amplified signal exits the VLSOA 110 via the amplifier output 114.

Note that the gain experienced by the optical signal as it propagates through the VLSOA 110 is determined in part by the gain value of the semiconductor gain medium 120 (it is also determined, for example, by the length of the amplifying path 130) and this gain value, in turn, is determined primarily by the lasing threshold for the laser cavity 140. In particular, the gain experienced by the optical signal as it propagates through each VLSOA 110 is substantially independent of the amplitude of the optical signal. This is in direct contrast to the situation with non-lasing SOAs and overcomes the distortion and crosstalk disadvantages typical of non-lasing SOAS.

Figure 6A:
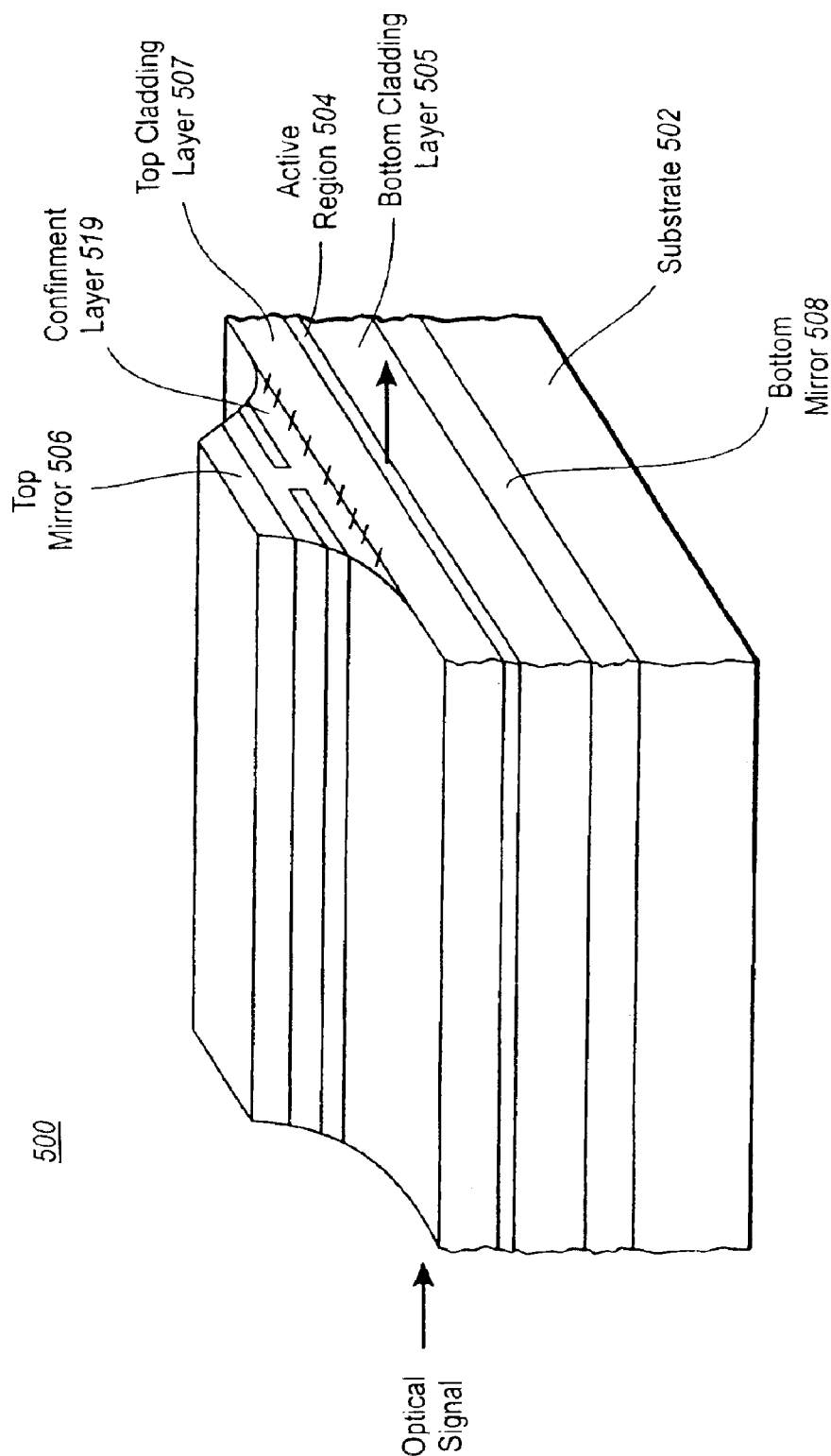
FIGS. 6A–6C are a perspective view, transverse cross-sectional view, and a longitudinal cross-sectional view of one embodiment of a vertically lasing semiconductor optical amplifier (VLSOA) 500.
Figure 6B:
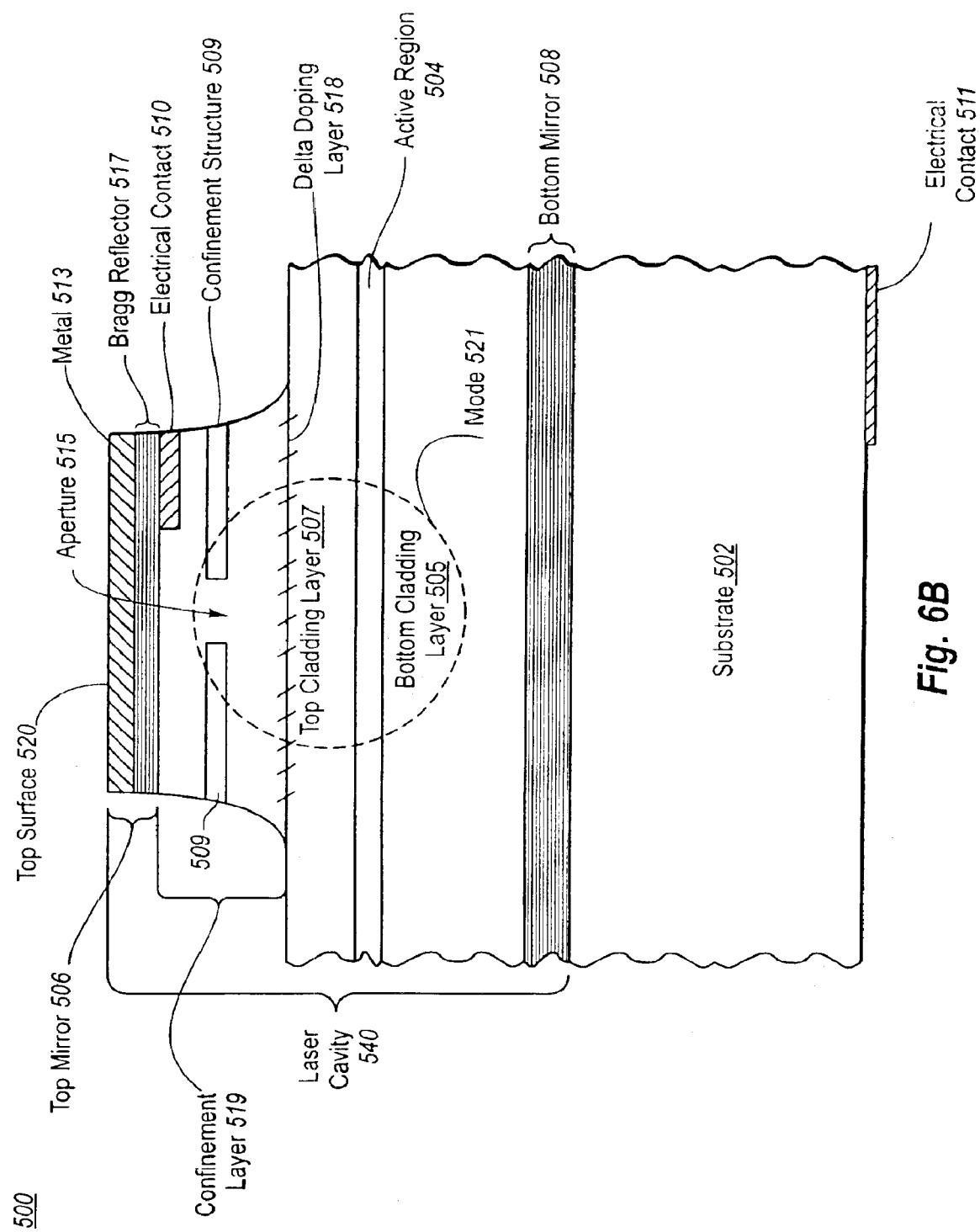
Figure 6C:
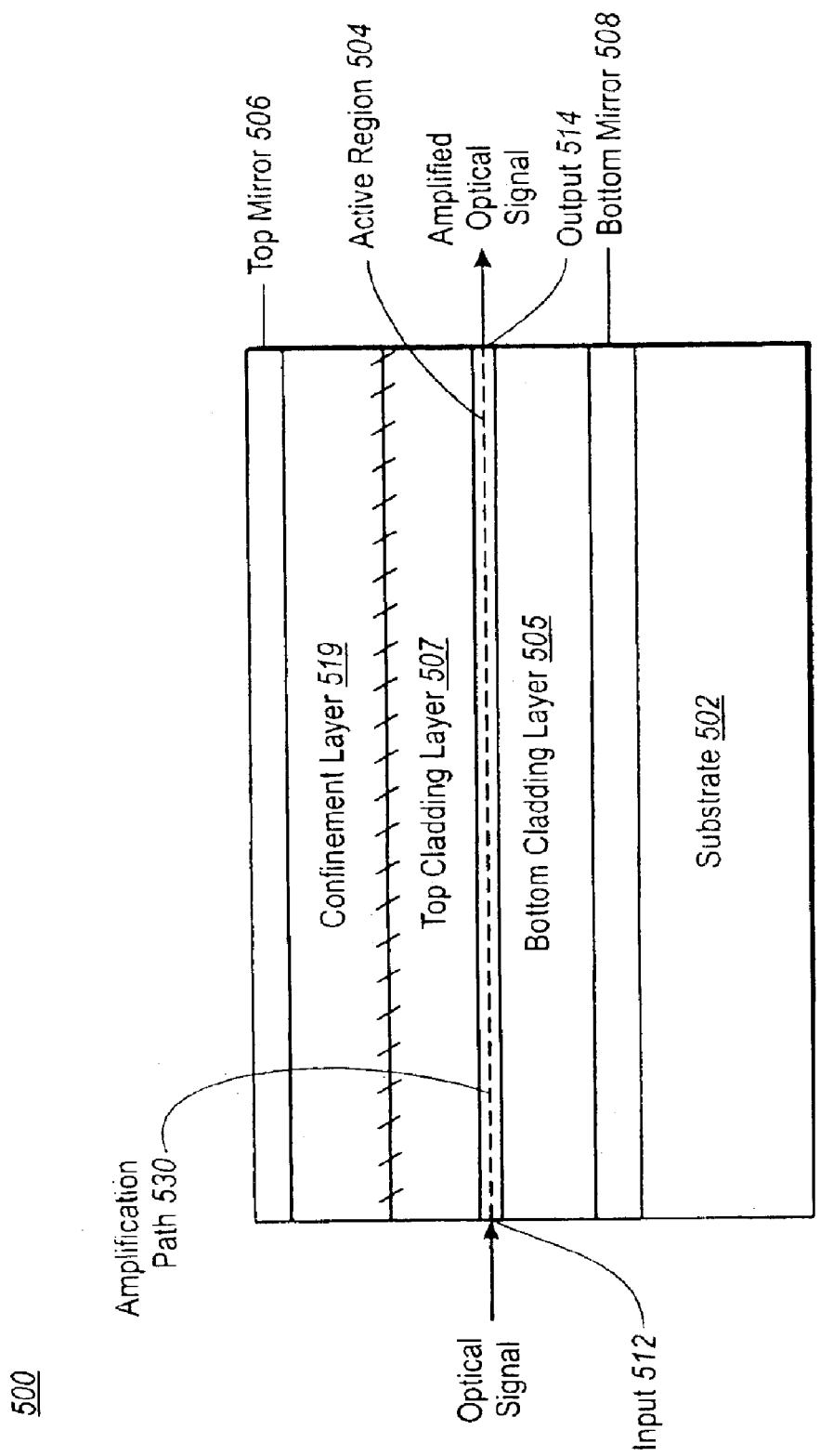

FIGS. 6A–6C are a perspective view, transverse cross-section, and longitudinal cross-section, respectively, of an example embodiment of a VLSOA 500, with FIG. 6B showing the most detail. Other VLSOA designs will be apparent.

Referring to FIG. 6B and working from bottom to top in the vertical direction (i.e., working away from the substrate 502), VLSOA 500 includes a bottom mirror 508, bottom cladding layer 505, active region 504, top cladding layer 507, confinement layer 519, and a top mirror 506. The bottom cladding layer 505, active region 504, top cladding layer 507, and confinement layer 519 are in electrical contact with each other and may be in direct physical contact as well. An optional delta doping layer 518 is located between the top cladding layer 507 and confinement layer 519. The confinement layer 519 includes a confinement structure 509, which forms aperture 515. The VLSOA 500 also includes an electrical contact 510 located above the confinement structure 509, and a second electrical contact 511 formed on the bottom side of substrate 502.

Comparing to FIG. 5, the semiconductor gain medium 120 includes the active region 504 and the laser cavity 140 is formed primarily by the two mirrors 506 and 508 and the active region 504. This embodiment is electrically pumped so the pump input 150 includes the electrical contacts 510,511.

VLSOA 500 is a vertical lasing semiconductor optical amplifier since the laser cavity 540 is a vertical laser cavity. That is, it is oriented vertically with respect to the amplifying path 530 and substrate 502. The VLSOA 500 preferably is long in the longitudinal direction, allowing for a long amplifying path 530 and, therefore, more amplification. The entire VLSOA 500 is an integral structure formed on a single substrate 502 and may be integrated with other optical elements. In most cases, optical elements which are coupled directly to VLSOA 500 will be coupled to the amplifying path 530 within the VLSOA. Depending on the manner of integration, the amplifier input 512 and amplifier output 514 may not exist as a distinct structure or facet but may simply be the boundary between the VLSOA 500 and other optical elements. Furthermore, although this disclosure discusses the VLSOA 500 primarily as a single device, the teachings herein apply equally to arrays of devices.

VLSOA 500 is a layered structure, allowing the VLSOA 500 to be fabricated using standard semiconductor fabrication techniques, preferably including organo-metallic vapor phase epitaxy (OMVPE) or organometallic chemical vapor deposition (OMCVD). Other common fabrication techniques include molecular beam epitaxy (MBE), liquid phase epitaxy (LPE), photolithography, e-beam evaporation, sputter deposition, wet and dry etching, wafer bonding, ion implantation, wet oxidation, and rapid thermal annealing, among others.

The optical signal amplified by the VLSOA 500 is confined in the vertical direction by index differences between bottom cladding 505, active region 504, and top cladding 507, and to a lesser extent by index differences between the substrate 502, bottom mirror 508, confinement layer 519, and top mirror 506. Specifically, active region 504 has the higher index and therefore acts as a waveguide core with respect to cladding layers 505,507. The optical signal is confined in the transverse direction by index differences between the confinement structure 509 and the resulting aperture 515. Specifically, aperture 515 has a higher index of refraction than confinement structure 509. As a result, the mode of the optical signal to be amplified is generally concentrated in dashed region 521. The amplifying path 530 is through the active region 504 in the direction in/out of the plane of the paper with respect to FIG. 6B.

The choice of materials system will depend in part on the wavelength of the optical signal to be amplified, which in turn will depend on the application. Wavelengths in the approximately 1.3–1.6 micron region are currently preferred for telecommunications applications, due to the spectral properties of optical fibers. The approximately 1.28–1.35 micron region is currently also preferred for data communications over single mode fiber, with the approximately 0.8–1.1 micron region being an alternate wavelength region. The term "optical" is meant to include all of these wavelength regions. In a preferred embodiment, the VLSOA 500 is optimized for the 1.55 micron window.

In one embodiment, the active region 504 includes a multiple quantum well (MQW) active region. MQW structures include several quantum wells and quantum wells have the advantage of enabling the formation of lasers with relatively low threshold currents. In alternate embodiments, the active region 504 may instead be based on a single quantum well or a double-heterostructure active region. The active region 504 may be based on various materials systems, including for example InAlGaAs on InP substrates, InAlGaAs on GaAs, InGaAsP on InP, GaInNAs on GaAs, InGaAs on ternary substrates, and GaAsSb on GaAs. Nitride material systems are also suitable. The materials for bottom and top cladding layers 505 and 507 will depend in part on the composition of active region 504.

Examples of top and bottom mirrors 506 and 508 include Bragg reflectors and non-Bragg reflectors such as metallic mirrors. Bottom mirror 508 in FIG. 6 is shown as a Bragg reflector. Top mirror 506 is depicted as a hybrid mirror, consisting of a Bragg reflector 517 followed by a metallic mirror 513. Bragg reflectors may be fabricated using various materials systems, including for example, alternating layers of GaAs and AlAs, $SiO_2$ and $TiO_2$, InAlGaAs and InAlAs, InGaAsP and Inp, AlGaAsSb and AlAsSb or GaAs and AlGaAs. Gold is one material suitable for metallic mirrors. The electrical contacts 510,511 are metals that form an ohmic contact with the semiconductor material. Commonly used metals include titanium, platinum, nickel, germanium, gold, palladium, and aluminum. In this embodiment, the laser cavity is electrically pumped by injecting a pump current via the electrical contacts 510,511 into the active region 504. In particular, contact 510 is a p-type contact to inject holes into active region 504, and contact 511 is an n-type contact to inject electrons into active region 504. Contact 510 is located above the semiconductor structure (i.e., above confinement layer 519 and the semiconductor part of Bragg reflector 517, if any) and below the dielectric part of Bragg reflector 517, if any. For simplicity, in FIG. 6, contact 510 is shown located between the confinement layer 519 and Bragg reflector 517, which would be the case if Bragg reflector 517 were entirely dielectric. VLSOA 500 may have a number of isolated electrical contacts 510 to allow for independent pumping within the amplifier. This is advantageous because VLSOA 500 is long in the longitudinal direction and independent pumping allows, for example, different voltages to be maintained at different points along the VLSOA. Alternately, the contacts 510 may be doped to have a finite resistance or may be separated by finite resistances, rather than electrically isolated.

Confinement structure 509 is formed by wet oxidizing the confinement layer 519. The confinement structure 509 has a lower index of refraction than aperture 515. Hence, the effective cross-sectional size of laser cavity 540 is determined in part by aperture 515. In other words, the confinement structure 509 provides lateral confinement of the optical mode of laser cavity 540. In this embodiment, the confinement structure 509 also has a lower conductivity than aperture 515. Thus, pump current injected through electrical contact 510 will be channeled through aperture 515, increasing the spatial overlap with optical signal 521. In other words, the confinement structure 509 also provides electrical confinement of the pump current. Other confinement techniques may also be used, including those based on ion implantation, impurity induced disordering, ridge waveguides, buried tunnel junctions, and buried heterostructures.

FIG. 13 was used to illustrate operation of VLSOA 110 as an amplifier. However, the VLSOA 110 can also be used for purposes other than amplification, for example switching, logic inversion and wavelength conversion. Referring again to FIG. 5, the four basic input and output ports of VLSOA 110 are the amplifier input 112 to the amplifying path 130, the amplifier output 114 of the amplifying path 130, a pump input 150 for pumping the semiconductor gain medium 150, and a ballast laser output (not labeled in FIG. 5) for the laser mode of the laser cavity 140. Depending on the mode of operation for the VLSOA 110, some of the ports may not be used and, accordingly, may not even exist as separate ports. For example, if no laser signal is output from the laser cavity 140, then there is no need for a ballast laser output.

As an example of another mode of operation, consider a situation in which the VLSOA operates as a switch. Here, the pump input 150 to the VLSOA 110 is used as a primary input to the VLSOA. The pump (e.g., a pump current) is varied from a value above the laser cavity threshold where the VLSOA exhibits significant amplification to a value below the laser cavity threshold where the VLSOA exhibits significant attenuation. Hence, the VLSOA functions as a switch, with the incoming optical signal passed (i.e., amplified) by the switch when the laser cavity is pumped above threshold and blocked (i.e., attenuated) when the pump input is turned off. This type of switch is particularly advantageous because the VLSOA can be switched between the on and off states very rapidly, typically in less than 1 ns, and can operate over a broad wavelength range. It also can achieve high extinction ratios, e.g. 20 dB attenuation in the off state with zero pump current and 30 dB amplification in the on state, for an overall modulation depth of 50 dB. Furthermore, with unity or higher amplification in the on state, these switches can be losslessly cascaded to form more complex circuitry.

As another example, the VLSOA 110 can also be configured to function as an inverter. In this application, the amplifier input 112 serves as the input to the inverter and the ballast laser output serves as the output. The pump input 150 acts as a power source and the amplifier output 114 is discarded. This configuration takes advantage of the fact that the laser produced by the laser cavity 140 acts as a ballast, as will be further described below. Hence, it will sometimes be referred to as the ballast laser or ballast laser signal. In other words, if the amplifier output is strong, the ballast laser output will be weak. But if the amplifier output is weak, the ballast laser output will be strong. Hence, if a weak signal (a digital "0") is input to the amplifier input, the resulting amplifier output will still be relatively weak and the ballast laser output will be strong (a digital "1"). Conversely, if a strong signal (digital "1") is input to the amplifier input, the resulting amplifier output will also be strong and the ballast laser output will be weak (digital "0"). Taken to an extreme, if no signal is input to the VLSOA, there will be no amplifier output and the ballast laser output will have its maximum strength. On the other hand, if a very strong signal is input to the VLSOA, the gain region will be saturated and lasing will be extinguished, resulting in no ballast laser output. Hence, the VLSOA operates as an inverter.

The VLSOA in the above example also acts as a wavelength converter because the wavelength of the ballast laser output is independent of the wavelength of the signal being amplified and, in fact, can be either shorter or longer than the wavelength of the signal being amplified. Hence, this type of wavelength converter has an advantage over conventional SOA-based wavelength converters in that it can convert to either a shorter or a longer wavelength. Other advantages include integration of the output ballast laser and SOA into a single device, high speed, and large dynamic range. A wavelength tunable VLSOA ballast laser based on a MEMS top mirror enables a wavelength tunable wavelength converter.

Figure 1A:
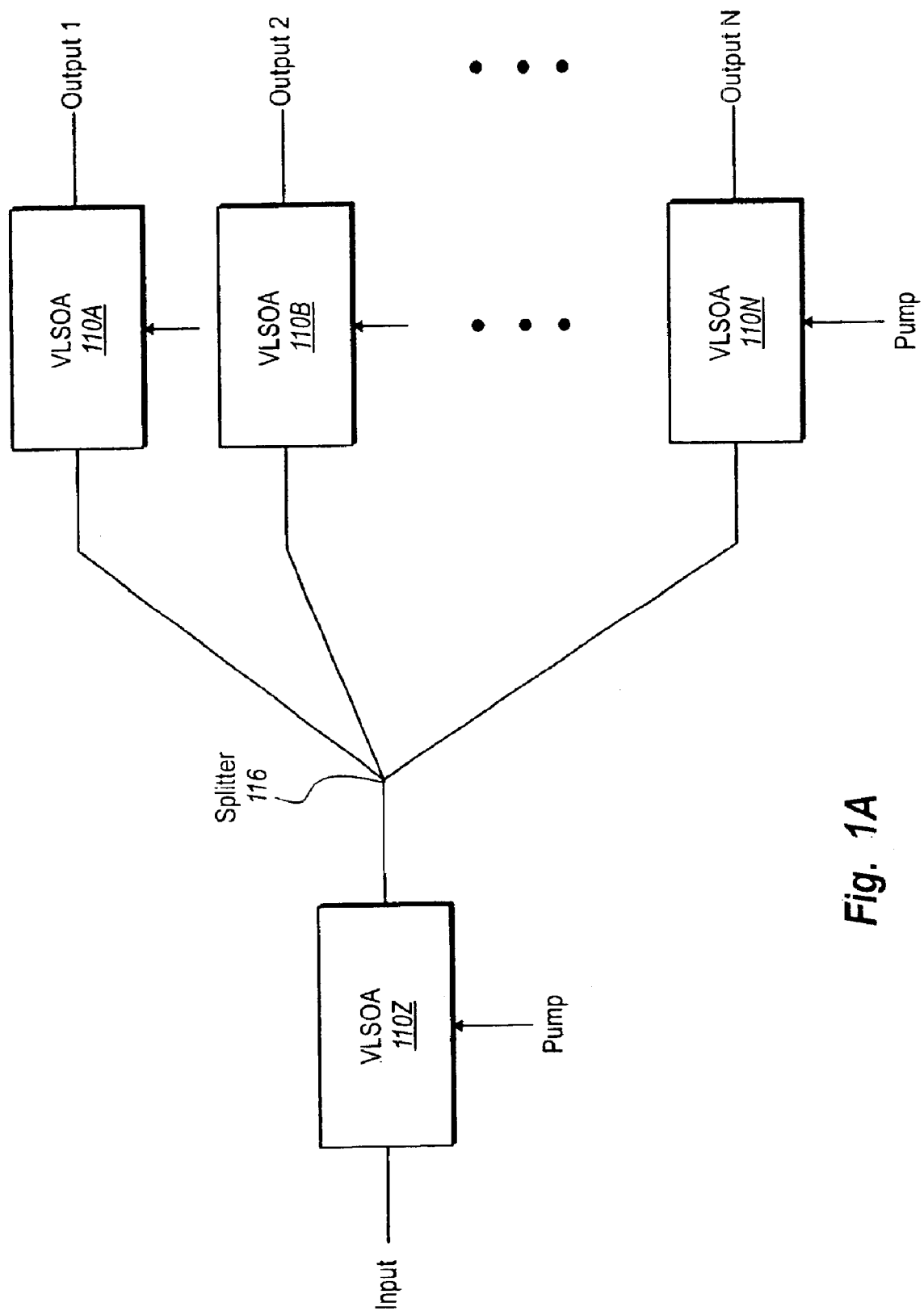
FIGS. 1A–4E are block diagrams of example integrated optical devices.
Figure 1B:
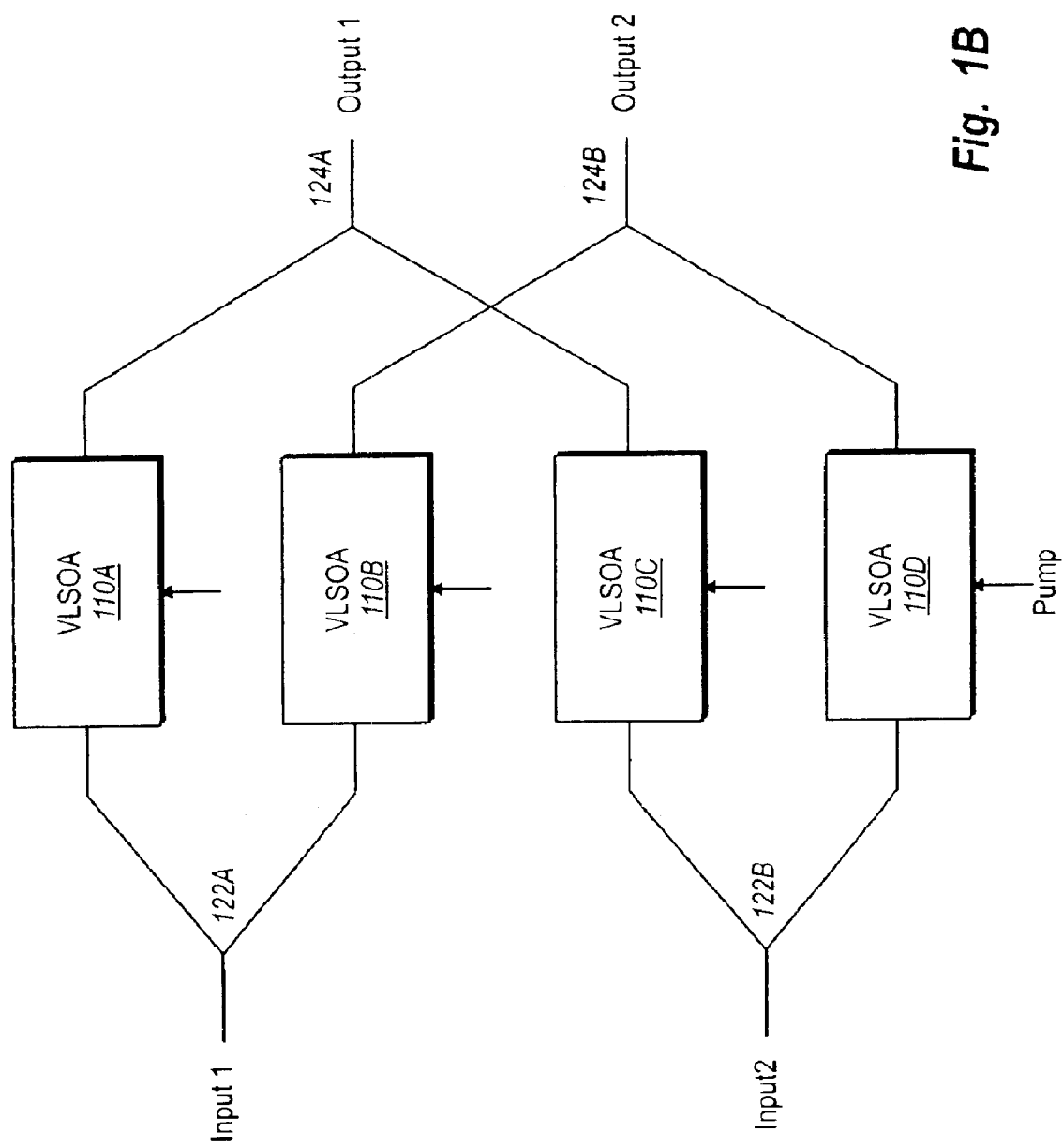
Figure 1C:
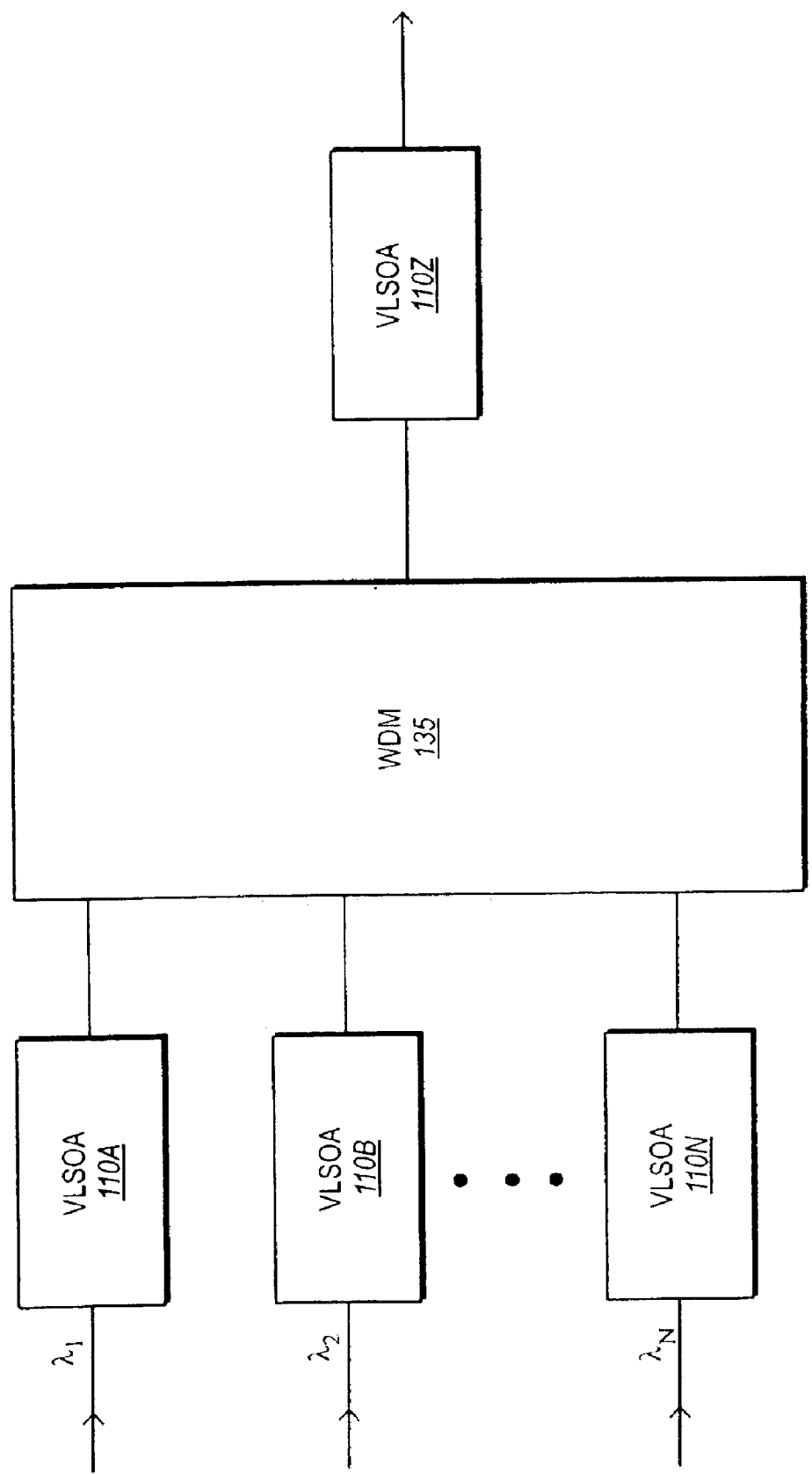
Figure 2A:
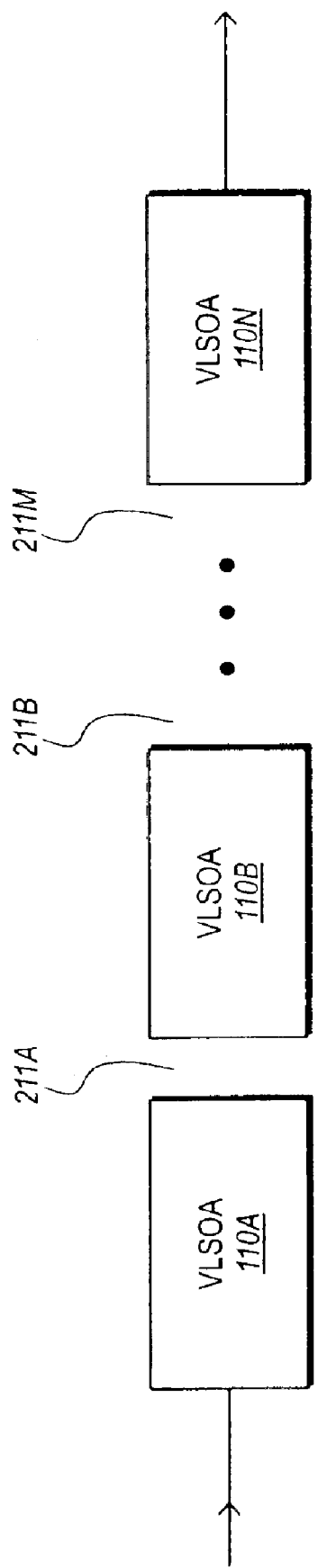
Figure 2B:
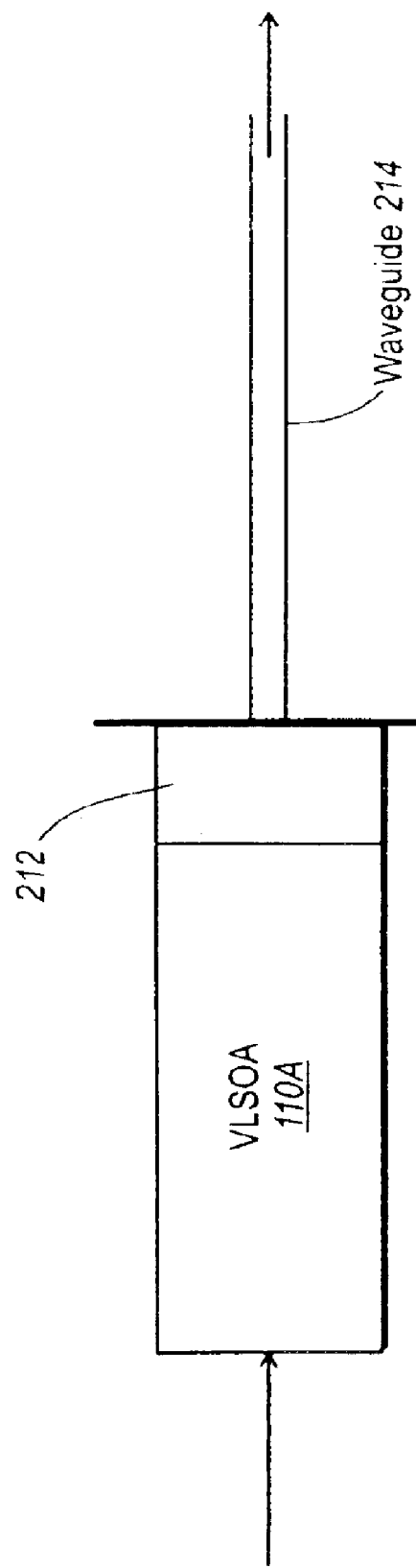
Figure 3A:
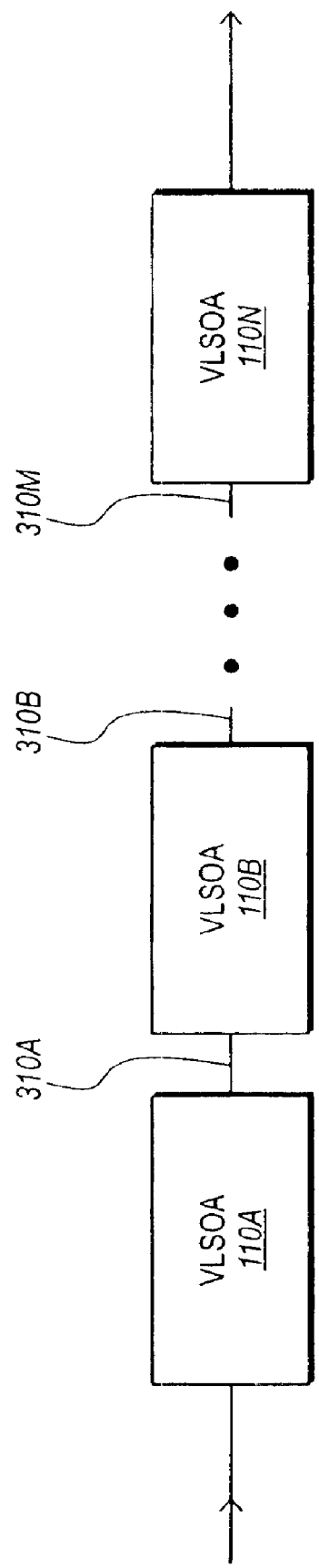
Figure 3B:
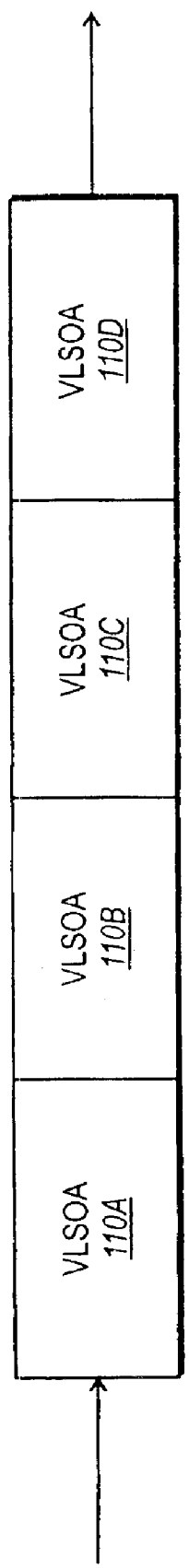
Figure 3C:
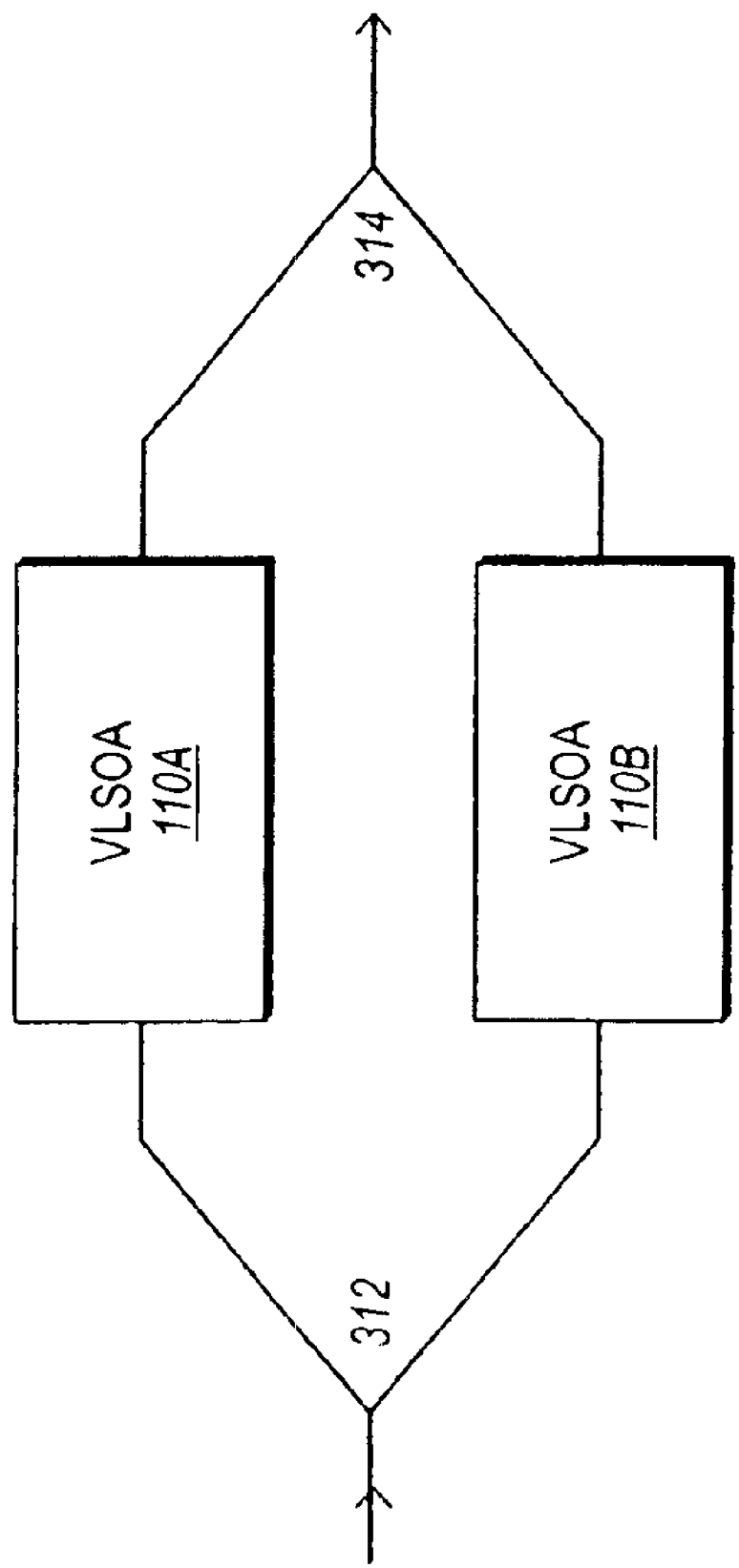

Returning now to FIGS. 1A–4E, these figures illustrate some example integrated optical devices but the invention is not meant to be limited to these devices, as will be apparent from the following discussion. Generally speaking, FIGS. 1A–1C are examples of devices with functionality useful for optical networks. FIGS. 2A–2B are examples of devices in which a VLSOA is combined with an unguided region. FIGS. 3A–3C are examples of more sophisticated optical amplifiers. FIGS. 4A–4E show example integrated optical devices in which a VLSOA is combined with an active optical element. In many of these examples, various components are shown as coupled by waveguides. This is not required. For example, the components may be coupled directly to each other.

FIG. 1A illustrates a 1:N switch, in which an input optical signal is routed to one or more outputs. The switch includes an optional VLSOA 110Z, a 1:N splitter 116, and N VLSOAs 110A–110N. These elements are coupled to each other as follows. The input to the switch device is coupled to the amplifier input of VLSOA 110Z, with the amplifier output of the VLSOA 110Z coupled to the splitter 116. Each of the N branches of splitter 116 is coupled to one of the VLSOAs 110A–110N, with each amplifier output of the respective VLSOA 110 representing one of the outputs of the overall switch.

The switch operates as follows. VLSOA 110Z provides a switch enable and overall amplification. If VLSOA 110Z is in the off state (e.g. pump current is zero), then the input optical signal is blocked. In other words, the switch is disabled. On the other hand, if VLSOA 110Z is in the on state (e.g., pumped above threshold), then the incoming optical signal is passed to splitter 116 and optionally also amplified. The optical signal is split by splitter 116 into N signals, each of which is received by one of the VLSOAs 110A–110N. If the input is to be routed to output 1, then the corresponding VLSOA 110A is pumped above threshold and the remaining VLSOAs 110B–110N are not pumped. As a result, the optical signal is passed by VLSOA 110A to output 1 whereas VLSOAs 110B–110N block outputs 2-N from receiving the signal. In other words, the incoming signal is switched from the input to output 1. The input signal may be routed to one or more other outputs by pumping the appropriate VLSOAs 110. This switch is fast (typically capable of Gbit/s switching), broadband (typically 100 nm or more), and lossless. Hence, it enables the ability to switch wavelength division multiplexed (WDM) signals, as well as high speed time division multiplexed (TDM) signals, for example >1 Gbit/s.

FIG. 1B illustrates a 2×2 crossbar. This device has two inputs and two outputs, and the two inputs may be reconfigurably routed to the two outputs. The crossbar includes two splitters 122A–122B, four VLSOAs 110A–110D and two combiners 124A–124B. Splitter 122A couples input 1 to VLSOAs 110A and 110B, and splitter 122B couples input 2 to VLSOAs 110C and 110D. On the output side, combiner 124A couples VLSOAs 110A and 110C to output 1 and combiner 124B couples VLSOAs 110B and 110D to output 2. The 2×2 crossbar operates along the same basic principles as the 1:N switch. Assume input 1 is to be routed to output 2 and input 2 to output 1. In this case, VLSOAs 110A and 110D are turned off (i.e. not pumped) and VLSOAs 110B and 110C are turned on (i.e., pumped above threshold), thus establishing the desired routing. Other routings may be achieved by pumping the appropriate VLSOAs 110. The basic architecture is extendible to different numbers of inputs and outputs.

FIG. 1C illustrates a wavelength division multiplexer for combining N optical signals at different wavelengths into a single multi-wavelength signal. This device includes VLSOAs 110A–110N, wavelength division multiplexer 135, and VLSOA 110Z. Each of the VLSOAs 110A–110N amplifies as necessary one of the incoming optical signals. Wavelength division multiplexer 135, for example an arrayed waveguide grating, combines the N incoming optical signals into a single multi-wavelength signal, which is then further amplified by VLSOA 110Z. When used in the reverse direction, this device functions as a wavelength division demultiplexer, splitting a multi-wavelength signal into N signals at different wavelengths.

FIG. 2A illustrates a low noise optical amplifier. This device includes a number of VLSOAs 110A–110N separated by transparent unguided regions 211A–211M. In one embodiment, the unguided region is waveguided in the vertical direction but unguided in the lateral direction. In another embodiment, the unguided region is unguided in both the vertical and lateral directions. For convenience, the VLSOAs 110 may be referred to as stages. As an optical signal propagates through this device, both the optical signal and noise (e.g., spontaneous emission generated within each stage 110) are amplified in each VLSOA stage 110. The amplified optical signal, however, couples more strongly from one VLSOA stage to the next because of its strong directionality. For example, the optical signal is guided within VLSOA stage 110A. It exits VLSOA stage 110A and enters unguided region 211A traveling in a direction towards the entry of VLSOA stage 110B. It will generally retain this directionality as it travels through the unguided region 211A and therefore will couple efficiently into the next VLSOA stage 110B. In contrast, spontaneous emission generated in stage 110A will not have as strong a directional component and will travel in many different directions in the unguided region 211A. Therefore, much of the noise will not couple into the next VLSOA stage 110B. That is, the unguided region 211A acts as a spatial filter, reducing the overall noise in the device.

FIG. 2B illustrates an integrated VLSOA 110A and window 212. These two integrated elements couple into a separate waveguide 214, such as a fiber or a waveguide which is fabricated separately. The window 212 is a short, transparent waveguided region in which the optical mode is more weakly guided than in the VLSOA 110A. The window 212 reduces gain ripple in VLSOA 110A. Gain ripple occurs when residual light reflects off of the ends of the VLSOA and couples back into the VLSOA, setting up longitudinal effects and possibly even a longitudinal optical mode within the VLSOA. The longitudinal mode enhances the gain within the VLSOA in a periodic fashion, based on the longitudinal cavity mode spacing. The end reflectivity of the VLSOA typically is less than $10^{-4}$ to $10^{-6}$ in order to reduce gain ripple to acceptable levels for many applications.

Window 212 helps to reduce gain ripple because it reduces the end reflectivity of the VLSOA. More specifically, since the VLSOA 110A and window 212 are integrated, there is no significant interface between VLSOA 110A and window 212 and hence no significant reflection. Instead, the main optical back reflection is generated by the interface between window 212 and waveguide 214. However, light reflected from this interface must travel through the window 212 twice before being coupled back into the VLSOA 110A. Since the window 212 is more weakly guided than VLSOA 110A, it acts as a spatial filter similarly to the unguided regions 211 in FIG. 2A. Hence, a significant portion of the back reflected light will not couple into VLSOA 110A, thus reducing the strength of any longitudinal effects and of the gain ripple. This effect can be further enhanced by tilting the interface with respect to the propagation path through the VLSOA. For example, in FIG. 2B, the interface between window 212 and waveguide 214 is perpendicular to the VLSOA amplifying path. If, instead, it were tilted, then back reflected light would be reflected away from the VLSOA amplifying path, further reducing the amount which couples back into the VLSOA 110A.

Window 212 may also be used as a mode converting section that helps to match the optical mode of the VLSOA 110A to the optical mode of the waveguide 214. A mode converting section is sometimes referred to also as a spot size converter. The VLSOA 110A and waveguide 214 may have very different optical modes, for example if the waveguide 214 is a fiber. Hence, if the VLSOA 110A were butted directly against waveguide 214, there would be a significant insertion loss due to the mode mismatch. With window 212, however, the mode of the optical signal exiting VLSOA 110A changes as it propagates across the unguided region 212. By the time it reaches waveguide 214, the mode is better matched to the mode of waveguide 214 and couples more efficiently into the waveguide 214. Mode conversion by window 212 can also be used to increase the alignment tolerances between the integrated device (i.e., VLSOA 110A and window 212) and the waveguide 214, for example enabling passive alignment.

Window 212 is also beneficial because it allows VLSOA 110A to be moved back away from the edge of the optical chip. This improves reliability and high power performance because the active area of VLSOA 110A, in its location away from the edge of the optical chip, is less exposed to the environment. It also allows the chip to be cleaved in areas away from VLSOA 110A. As a result, materials which degrade quickly with environmental exposure (e.g. aluminum containing semiconductor layers) or which do not cleave well (e.g. polycrystalline dielectric layers) may be used in the VLSOA 110A.

FIG. 3A illustrates a multistage amplifier. This device includes a number of VLSOA stages 110A–110N, which are coupled to each other by waveguides 310A–310M. In this device, each VLSOA stage 110 may be optimized for its position in the amplification stage. For example, in a preferred embodiment using three stages, the first stage 110A is optimized for low noise, the second stage 110B for high total gain, and the last stage 110C for high output power.

FIG. 3B illustrates a broadband optical amplifier. This device includes four VLSOA stages 110A–110D, which are coupled in series. Each stage 110 is optimized to amplify light within a specific wavelength region and to pass light of other wavelength regions. Thus, the overall device has a broader spectral response. In one example, stages 110A and 110C are identical and are optimized to amplify light in the 1.3–1.4 micron region, and stages 110B and 110D are optimized to amplify light in the 1.4–1.5 micron region. The overall amplifier provides amplification over the 1.3–1.5 micron region. Other wavelength regions and numbers of wavelength regions may also be used.

FIG. 3C illustrates another type of broadband optical amplifier. This device includes a wavelength division demultiplexer 312, two VLSOAs 110 and a wavelength division multiplexer 314, coupled in series. The wavelength division demultiplexer 312 splits the incoming signal into two signals by wavelength, one of which travels to the VLSOA 110A and the other of which travels to VLSOA 110B. Continuing the above example, assume the incoming light spans the 1.3–1.5 micron spectral region. Wavelength division demultiplexer 312 sends the 1.3–1.4 micron portion of the optical signal to VLSOA 110A and sends the 1.4–1.5 micron portion to VLSOA 110B. Each VLSOA 110 is optimized to amplify the received signal and the amplified signals are recombined by wavelength division multiplexer 314. This device can be used to achieve twice the bandwidth and/or twice the saturation power as compared to a discrete VLSOA of equal performance to 110A or 110B. Again, other wavelength regions and numbers of wavelength regions may be used. In one variant, wavelength division demultiplexer 312 is replaced by a wavelength-insensitive optical splitter. This variant is easier and less costly to fabricate but has lower performance due to the wavelength insensitivity of the splitter.

Figure 4A:
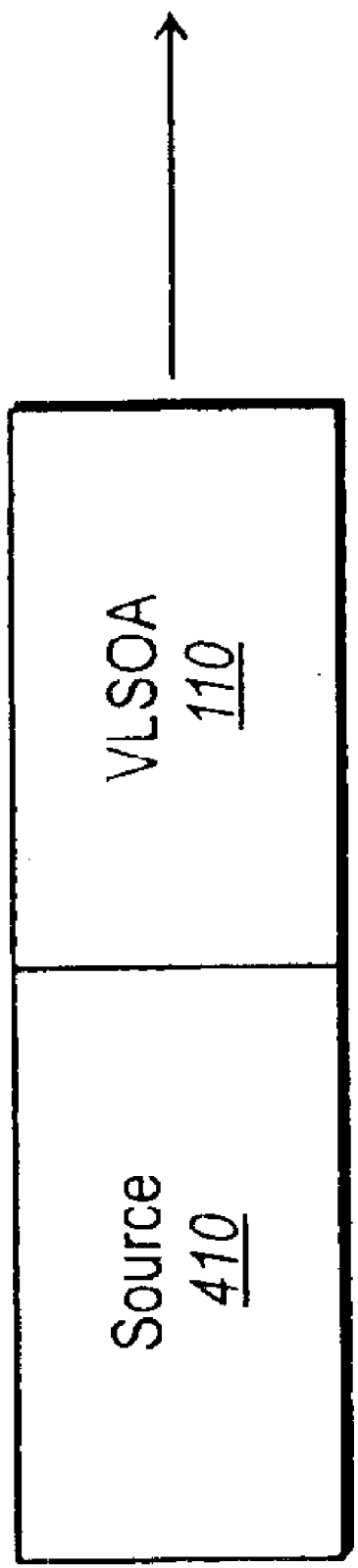

In FIG. 4A, an optical source 410 is coupled to VLSOA 110. In one example, optical source 410 is a multiple wavelength laser source suitable for telecommunications applications. A common implementation of this type of laser includes multiple electroabsorption modulated DBR lasers operating at different wavelengths, with their outputs coupled together into a single output waveguide. Integration of this type of optical source 410 with VLSOA 110 results in a fully integrated WDM (wavelength division multiplexed) transmitter that can produce enough power to be used in optical communications systems without external amplification. The VLSOA 110 has many advantages over conventional SOAs and other integrated amplifier technologies. For example, the VLSOA 110 generally can support high speed modulation (e.g., >1 Gb/s), simultaneous operation of multiple wavelength channels, and high output powers (e.g., >10 dBm). Alternatively, the source 410 may be a DBR laser, tunable DBR laser, tunable or wavelength selectable laser, waveguide coupled WDM laser array, Fabry Perot laser or any other type of laser or light emitting diode. The source may also be a complex integrated telecom source including one or more tunable DBR lasers, couplers, electroabsorption modulators, detectors, splitters, combiners, and wavelength locking devices.

Figure 4B:
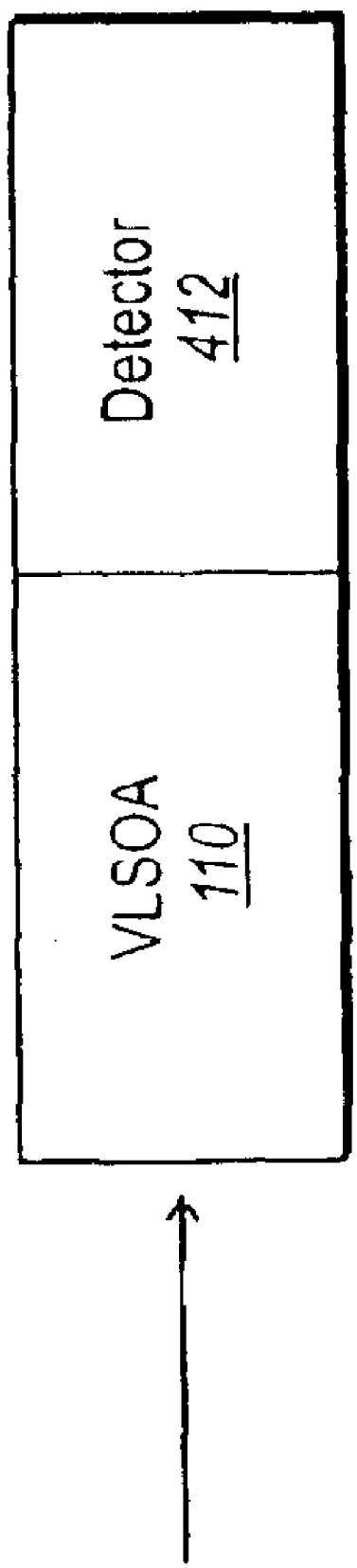

FIG. 4B illustrates a VLSOA 110 coupled to a detector 412. In one embodiment, detector 412 is a short waveguided section coupled to the end of the VLSOA 110. The detector 412 preferably has a lower bandgap material in its detector waveguide core region than is present in the VLSOA active region. The detector 412 core region has the same waveguide and p-i-n structure as the VLSOA 110 active region but is reverse biased, thereby producing a photo-induced current that is proportional to the amount of light passing through the device.

In one example application, the detector 412 measures the power of optical signals in the VLSOA 110 (e.g., the output power of the VLSOA). These measurements are used to monitor and/or control the gain and output power of the VLSOA 110. In another example application, the integrated VLSOA 110 and detector 412 is used as a high sensitivity amplified photodetector. In a third implementation, a passive waveguide coupler is integrated at the end of the VLSOA 110 and diverts a small fraction of the VLSOA signal to the detector 412, which is separated from the main signal path. In a fourth example, the detector 412 is placed to the side of the main optical path, without any direct coupling from the VLSOA 110. The detector 412 is used to detect scattered or evanescent light. As a final example, the detector 412 may be integrated above or below the VLSOA 110 in order to monitor the power of the lasing field of the VLSOA (i.e., the vertical laser mode rather than the optical signal being amplified). This can then be used to monitor and tune the performance of the VLSOA 110.

Figure 4C:
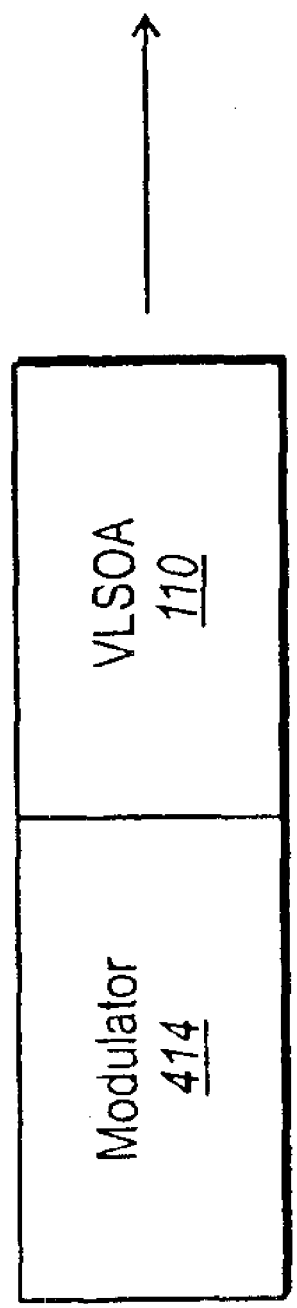

FIG. 4C shows a modulator 414 coupled to a VLSOA 110. In one embodiment, modulator 414 is an electroabsorptive modulator. This embodiment is suited for use in optical communications systems, with the modulator 414 impressing the data to be transmitted onto an optical carrier and the VLSOA 110 then amplifying the signal in preparation for transmission over an optical fiber, for example. Use of the VLSOA is advantageous because the VLSOA's low crosstalk characteristics allow the signal to be first modulated and then amplified. This, in turn, enables higher output powers and other benefits. In other applications, the integrated device combines high speed broad band modulation and switching capability with unity or positive fiber-to-fiber gain, which is difficult if not impossible to achieve with other integrated technologies. Other example of modulator 414 include a waveguided section which is modulated in some respect and interferometric modulators, such as a Mach Zender modulator.

Figure 4D:
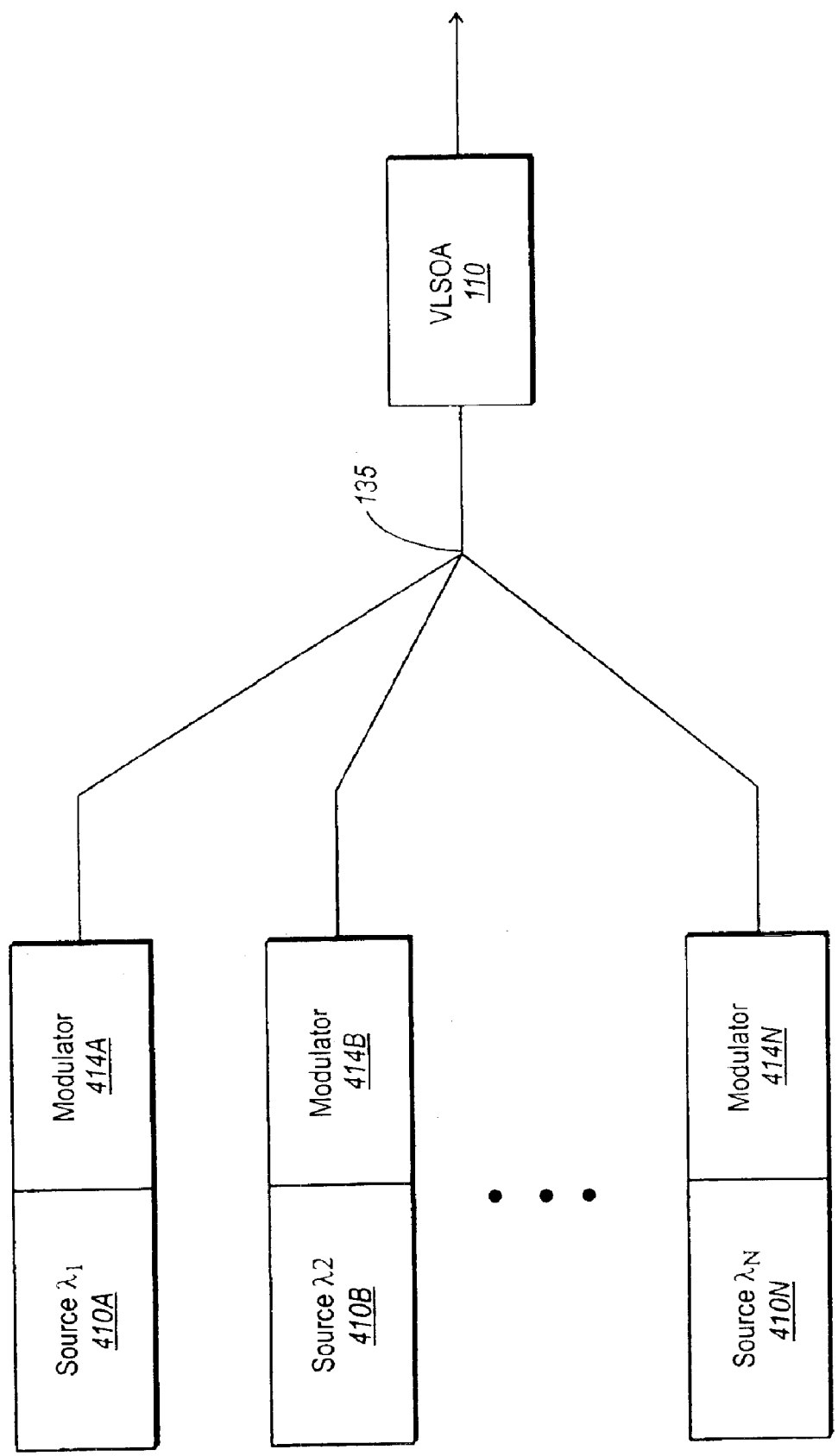

FIG. 4D shows a more sophisticated version of the device in FIG. 4C. This embodiment includes N optical sources 410A–410N, each coupled to a corresponding modulator 414A–414N. The outputs of modulators 414 are coupled to a WDM multiplexer or passive combiner 135 leading to a VLSOA 110. Each of the optical sources 410 produces an optical carrier at a different wavelength. Data is impressed upon these carriers by modulators 414. The modulated optical signals are combined by WDM multiplexer 135 and then amplified by VLSOA 110. As discussed previously, non-lasing SOAs may not be used in place of VLSOA 110 due to the high cross-talk characteristics of non-lasing SOAs. In a preferred embodiment, the sources 410 are DBR lasers and the modulators 414 are electroabsorptive modulators, thus making the entire device suitable for use in high-speed optical communications systems.

Figure 4E:
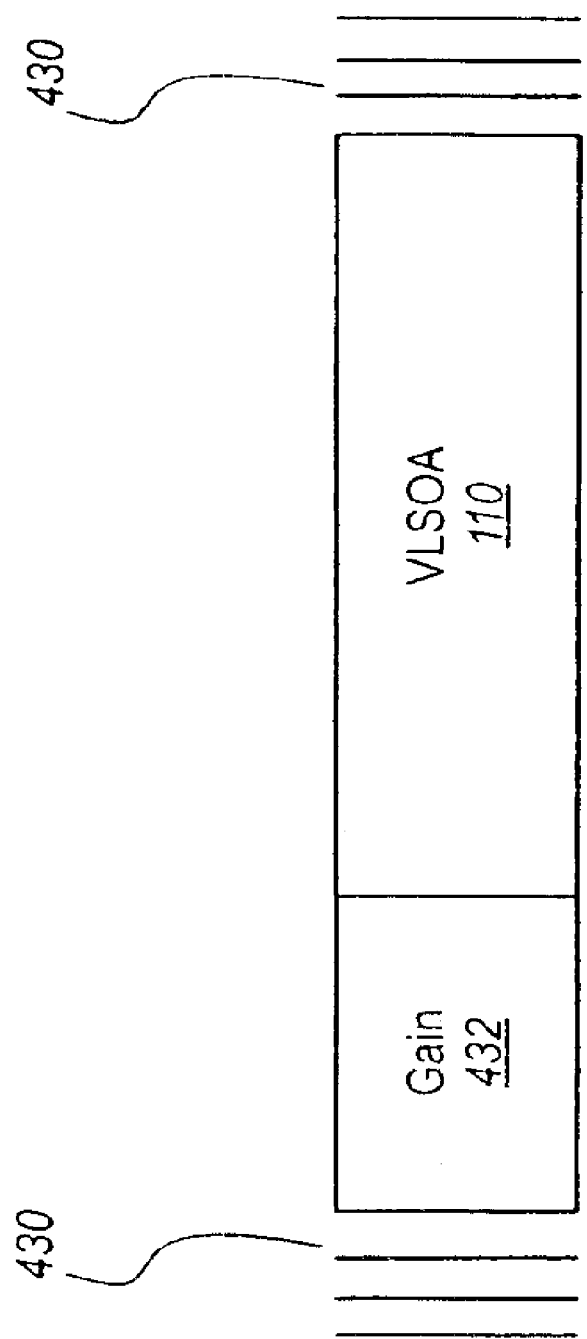

FIG. 4E is a diagram of an improved laser design. Many current lasers are susceptible to parasitic reflections from surfaces outside of the laser cavity. For example, a conventional DBR laser has a laser cavity formed by two end mirrors surrounding a gain region. Laser light is emitted through one of the end mirrors. The light, however, may encounter interfaces outside of the DBR laser which generate reflections back into the DBR laser's cavity. For example, if the light from the DBR laser is injected into an optical fiber, fiber interfaces may generate back reflections which couple back into the DBR laser. The back-reflected photons extract carriers from the laser's gain region, thus changing the gain. This, in turn, induces intensity and phase noise and broadens the linewidth of the laser source. Currently, optical isolators are used to prevent instability due to these back-reflections. However, adding an isolator increases the overall component count and cost, increases assembly time and cost, and increases the size of the overall laser assembly.

The laser of FIG. 4E significantly reduces or even eliminates the need for a separate isolator because its structure is inherently feedback insensitive. The laser includes two end mirrors 430 surrounding a short gain region 432 and a VLSOA 110. The laser cavity is defined by the two end mirrors 430, which preferably are DBR mirrors. The gain for the laser cavity is provided mainly by the gain region of VLSOA 110 but also to a lesser degree by gain region 432. This design reduces the problem described above for the following reason. The gain region in VLSOA 110 is clamped to a constant value. Hence, back-reflected photons do not cause changes in the gain of VLSOA 110 and, therefore, do not result in the unwanted effects described above. The short gain region 432 is included so that the structure can lase both vertically in the VLSOA and longitudinally between the two end mirrors. Without this region 432, there would be only a single laser cavity which would support only the laser mode with the lowest lasing threshold. The gain region 432 is susceptible to back-reflected photons but since it is short in comparison to the overall gain path, the overall effect is significantly reduced.

When used as an amplifier, VLSOA 500 operates as follows. Pump current is injected through contacts 510,511, or, more precisely, holes are injected through contact 510 and electrons through contact 511. These holes and electrons flow to the active region 504, where they increase the carrier density in the active region 504. That is, the pump current is used to pump 230 the active region 504. The pump current is laterally confined by aperture 515 and confinement structure 509. The pump current is sufficiently high to exceed a lasing threshold for vertical cavity 540. As a result, laser radiation is generated by the vertical cavity 540. This laser radiation may be emitted from the vertical cavity, for example, through the top surface 520 or into the substrate 502 or it may be generated but not actually emitted from the VLSOA 500. The laser radiation may lie in the visible, infrared, ultraviolet or other frequency range.

While the laser cavity 540 is operating above the lasing threshold, an optical signal is received 210 at amplifier input 512 and propagates 220 through the VLSOA 500 along the amplifying path 530. As the optical signal propagates through the active region 504, the optical signal is amplified 240 by a gain multiplier due to stimulated emission of additional photons. The gain multiplier is substantially constant (i.e., independent of the amplitude of the optical signal) because the laser radiation produced by laser cavity 540 acts as a ballast to prevent gain saturation. That is, when the optical signal is weaker, fewer additional photons are stimulated by the optical signal. but more laser radiation is generated. But when the optical signal is stronger, more additional photons are stimulated by the optical signal, but less laser radiation is generated. Typically, the value of the constant gain multiplier is inversely proportional to the loss of the cavity mirrors 506 and 508. For example, ignoring internal loss, if a 0.2% mirror loss (99.8% reflectivity) results in a gain of 10 dB (10 times), then a three times larger 0.6% loss (99.4% reflectivity) would result in a roughly three times larger logarithmic gain of 30 dB (1000 times) for otherwise identical VLSOAs 500. The amplified signal exits the VLSOA 500 at amplifier output 514.

Figure 7:
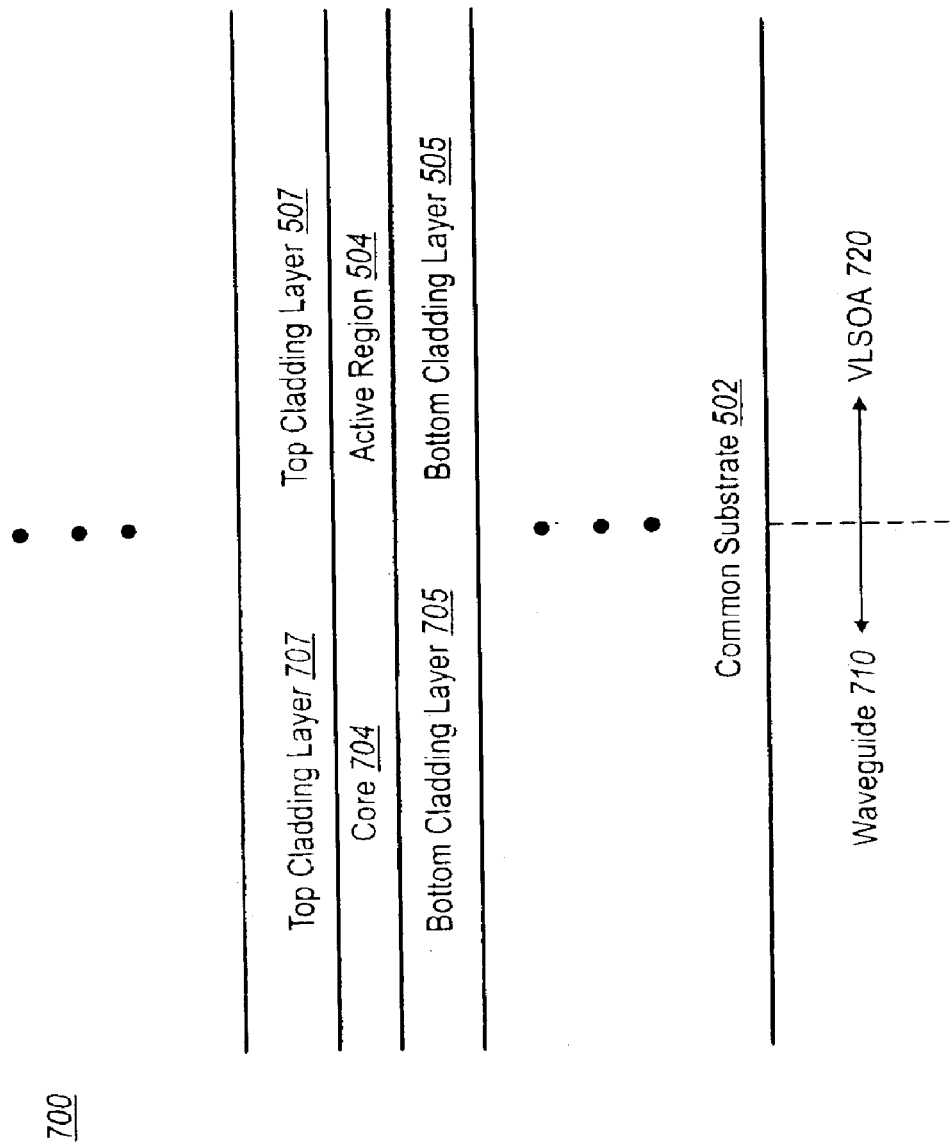
FIG. 7 is a simplified longitudinal cross-sectional view of an example integrated optical device 700 which includes an optical waveguide 710 coupled directly to a VLSOA 720.
Figure 8:
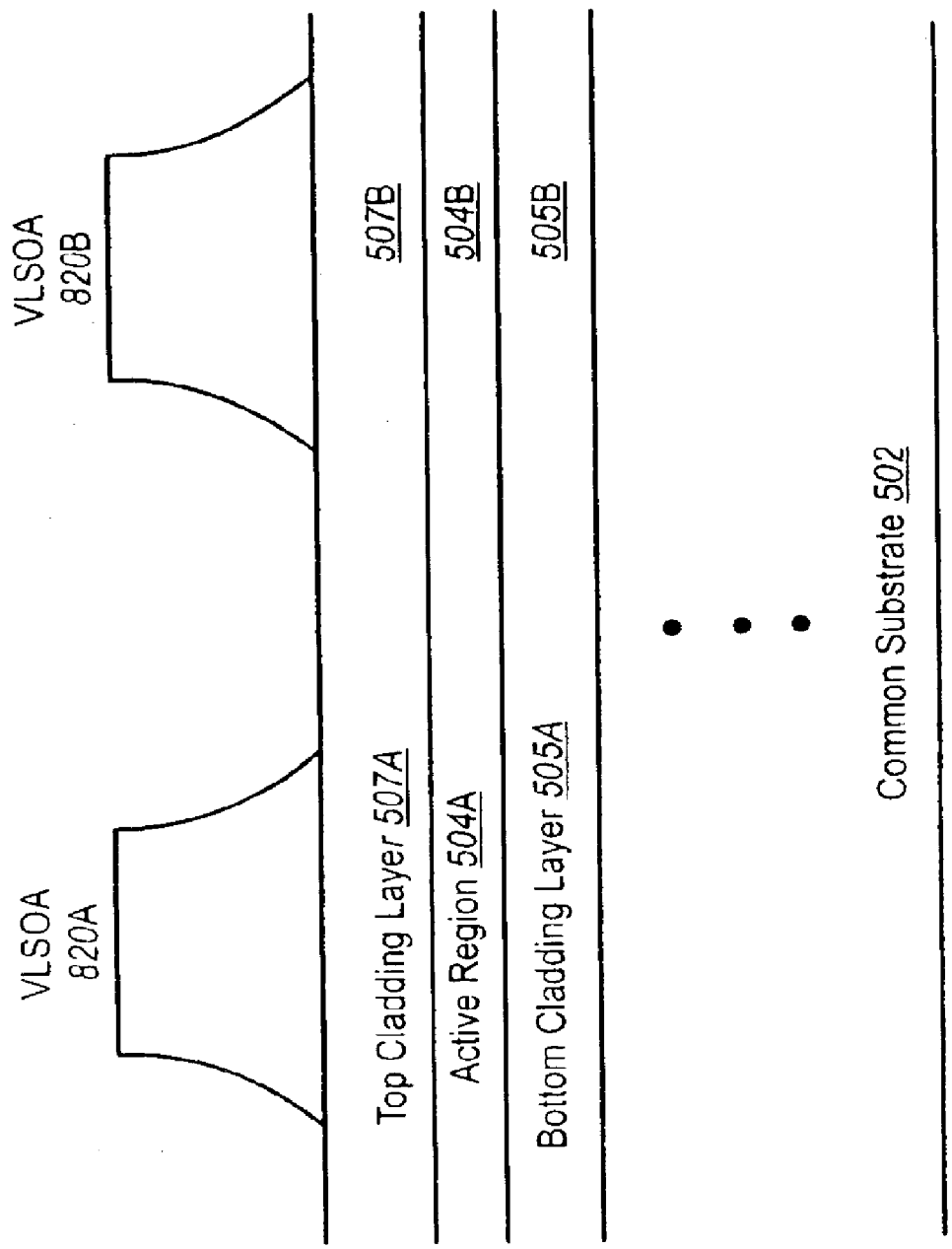
FIG. 8 is a simplified transverse cross-sectional view of an example integrated optical device 800 which includes two VLSOAs 820A and 820B.

The two example devices 700 and 800 shown in FIGS. 7 and 8 are used in conjunction with FIGS. 9–12 to illustrate various techniques for fabricating integrated optical devices, including those shown in FIGS. 1–4.

FIG. 7 is a simplified longitudinal cross sectional view of an integrated optical device 700 which includes an optical waveguide 710 coupled directly to a VLSOA 720. Many designs for waveguide 710 and VLSOA 720 are appropriate; but in the following descriptions, VLSOA 720 is assumed to follow the design of FIG. 6 and waveguide 710 is assumed to be similarly constructed. For simplicity, FIG. 7 shows only the substrate 502, bottom cladding layer 505, active region 504 and top cladding layer 507 of VLSOA 720. These various layers continue into the waveguide 710. In particular, the bottom cladding layer 505 of VLSOA 720 transitions into the bottom cladding layer 705 of waveguide 710, the active region 504 transitions into the core 704 of waveguide 710, and the top cladding layer 507 transitions into the top cladding layer 707 of the waveguide 710. The core 704 has a higher index of refraction than the surrounding cladding layers 705,707, thus forming the basic structure of waveguide 710.

In one embodiment, bottom cladding layers 505 and 705 are identical as are top cladding layers 507 and 707. However, active region 504 and core 704 are different, as will typically be the case. Core 704 is transparent at the wavelength of interest (or at least absorption has somewhat been minimized) whereas active region 504 is designed to support the amplification function of VLSOA 720. The core 704 and active region 504 are aligned in order to reduce the optical reflection at the interface of the two optical elements and also to increase the coupling efficiency between the two optical elements. This is a common configuration since the optical mode typically is confined by the core 704 in waveguide 710 and by the active region 504 in VLSOA 720. Therefore, aligning core 704 to active region 504 typically will reduce the optical reflection and increase the coupling efficiency between the optical modes in the two elements. Low reflection is important to prevent gain ripple and/or parasitic lasing modes in the VLSOA 720, as was previously discussed.

Integrated optical device 700 is merely an example used to illustrate principles which can be used to fabricate many different types of integrated optical devices. For example, in some of the fabrication techniques described below, device 700 is fabricated by beginning with a common structure for both core 704 and active region 504 and then changing the "transition energy" in one of the two areas to achieve the different properties desired. The term "transition energy" is used to mean the change in energy for the energy transitions which are relevant to a particular device. In many devices, the transition energy is determined by the bandgap energy of the bulk materials of the device. However, the transition energy can be affected by other parameters as well. For example, in quantum wells, the quantum confinement energy also affects the transition energy. As a result, changing the width of quantum wells without changing the bulk material composition can result in changes in the transition energy.

Returning to the discussion of device 700, semiconductor structures are transparent, meaning that they have much lower absorptions, for light with photon energies which are less than the transition energy for the structure. Thus, in one approach, device 700 is fabricated by fabricating an active region 504 with an appropriate transition energy for the wavelength of interest. The portion of the structure which is to form the core 704 is further processed to increase the transition energy, thus making it transparent at the wavelength of interest. For example, if the transition energy depended solely on the bandgap energy of the materials in active region 504, the material composition could be selected to achieve the desired bandgap energy and hence also the correct transition energy. In core 704, the material composition would be altered in order to achieve a higher bandgap energy.

This fabrication approach is described below in the context of the specific device 700 but it has much broader applicability. For example, it is also appropriate for other situations in which passive and/or transparent optical elements are integrated with VLSOAs on a common substrate. For example, it is applicable to the optical devices of FIGS. 1A, 1B, 1C, 3A and 3C since these devices contain the exact configuration of an optical waveguide 710 coupled directly to a VLSOA 720, which is a common configuration. However, it is also applicable to situations in which the waveguide and VLSOA form part of a larger integrated optical device but are not directly coupled to each other. The fabrication principles are also applicable to the fabrication of transparent, unguided regions, as shown in FIGS. 2A and 2B. In other words, engineering the transition energy to convert an opaque material to a transparent material can be used to form both transparent waveguides and transparent unguided regions. In addition, in the example above, the initial structure was engineered to have a transition energy appropriate for VLSOA 720 and the core 704 was further processed to achieve the transition energy desired for waveguide 710. As a variant, the initial structure could be engineered to have a transition energy appropriate for waveguide 710 and the active region 504 further processed to achieve the transition energy desired for VLSOA 720. Furthermore, the specific designs and alignment of the optical elements shown in FIG. 7 also are not required. For example, the top cladding layer 507 of VLSOA 720 may be aligned with and/or be based on a common structure as the core 704 of waveguide 710. Other variations for this and other fabrication techniques will be apparent.

FIG. 8 is a simplified transverse cross sectional view of an example integrated optical device 800 which includes two VLSOAs 820A and 820B, each of which is optimized for a different wavelength. The optical device of FIG. 3C would have this type of cross-section. As in FIG. 7, the views are simplified to show only the substrate 502, bottom cladding 505A,B, active region 504A,B, and top cladding layers 507A,B. Many designs for the VLSOAs 820 may be used; but in the following description, they are assumed to follow the design of FIG. 6.

As with device 700, integrated optical device 800 is an example used to illustrate principles which can be used to fabricate many different types of integrated optical devices. Analogous to device 700, some of the fabrication techniques discussed below are based on engineering the transition energy of a semiconductor structure in order to achieve the different wavelength sensitivities for the active regions 504A and 504B, respectively. For example, active region 504A can be designed for a transition energy of 0.81 eV in order to amplify the 1.50–1.55 μm wavelength range, and active region 504B can be designed for a transition energy of 0.79 eV in order to amplify the 1.55–1.60 μm wavelength range. Again, this approach has much broader applicability than just the specific configuration of device 800. For example, it is applicable to situations in which the VLSOAs are coupled directly to each other, as shown in FIG. 3B. In this case, the active regions 504A and 504B often will be aligned to each other in order to increase the coupling efficiency and/or to decrease the manufacturing complexity. This fabrication technique is also applicable to devices in which a VLSOA is integrated with another active optical element on a common substrate, such as in FIGS. 4A–4E. In many of these integrated devices, the active region is tuned, for example by engineering the transition energy, in order to optimize the performance of the element. As with FIG. 7, other variations for this and other fabrication techniques will be apparent.

Figure 9A:
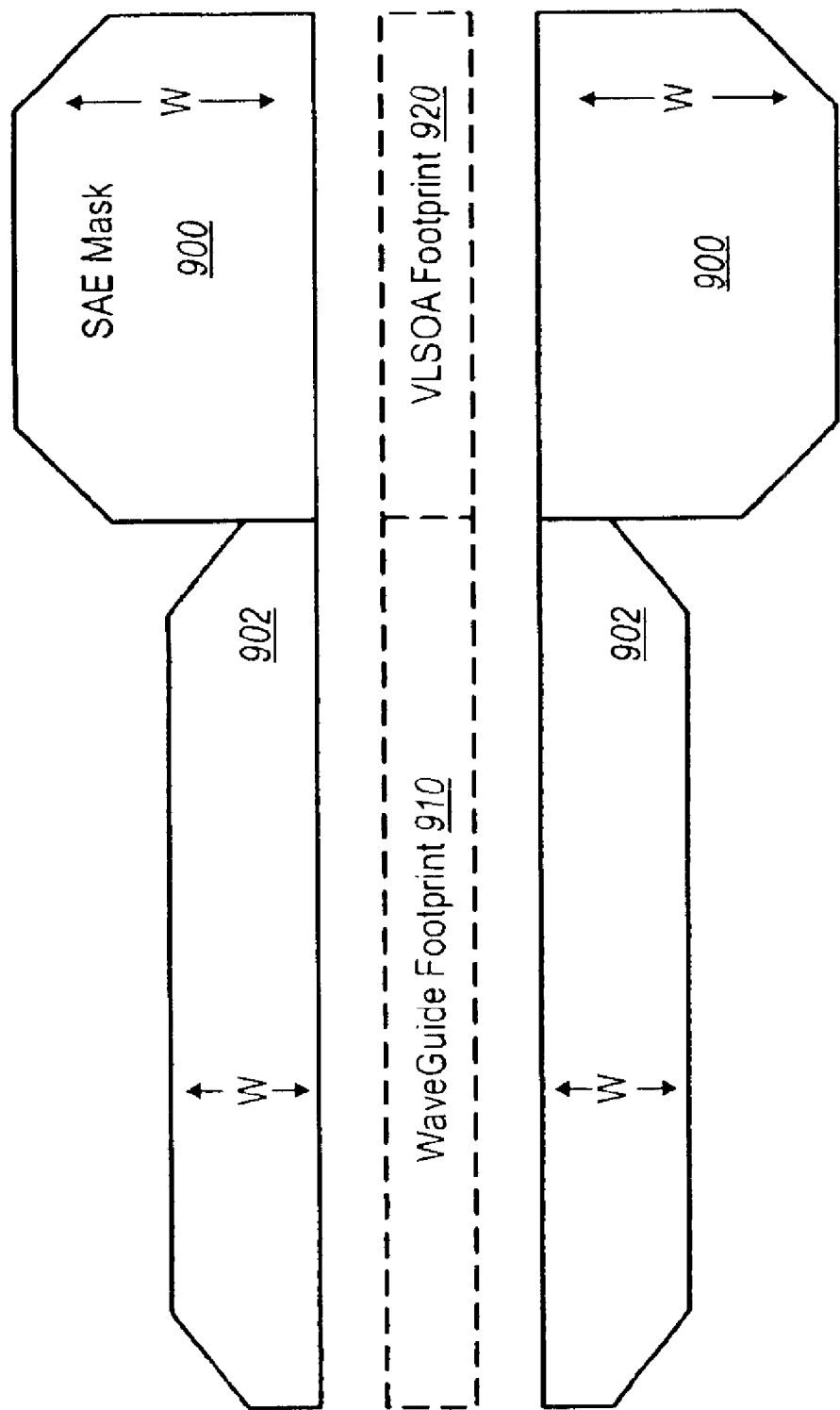
FIG. 9A is a top view of the placement of selective area epitaxy (SAE) masks used to fabricate integrated optical device 700.
Figure 9B:
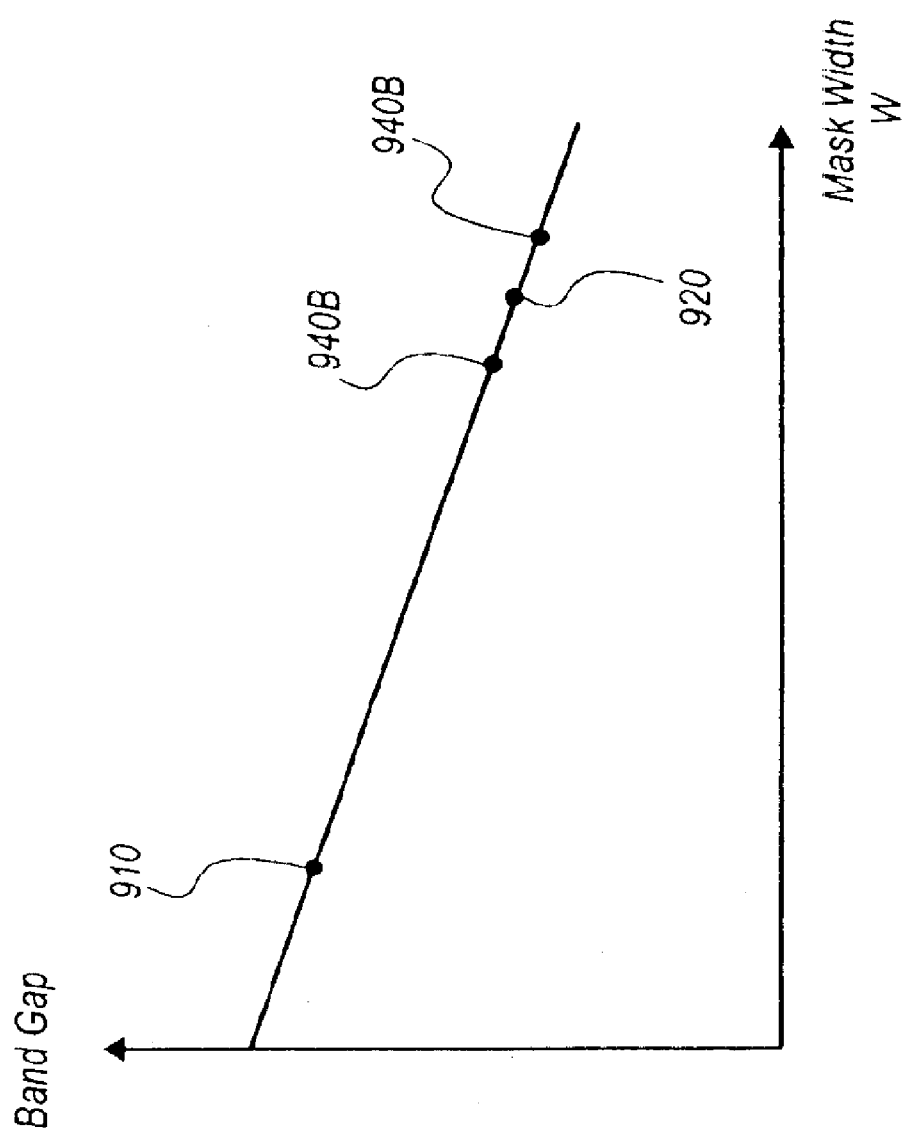
FIG. 9B is a graph of bandgap energy as a function of material composition illustrating the effect of SAE masks.

FIGS. 9A and 9B illustrate the fabrication of integrated optical device 700 using selective area epitaxy (SAE). In a preferred embodiment, device 700 is fabricated as follows. First, both the waveguide 710 and VLSOA 720 are fabricated through their bottom cladding layers 505,705. Next, active region 504 of the VLSOA 720 and core 704 of the waveguide 710 are formed simultaneously. More specifically, one material is grown to form the active region 504 and a different material is grown to form the core 704, although both materials are grown simultaneously using a common fabrication process.

FIG. 9A is a top view of selective area epitaxy (SAE) masks used to achieve this. The dashed lines show the final footprints 910,920 of waveguide 710 and VLSOA 720, respectively. At this point in manufacturing, part of the bottom cladding layer 505,705 has been deposited and no active region 504 or core 704 has been grown. SAE masks 900 are formed on the surface of the substrate in close proximity to the VLSOA footprint 920 and SAE masks 902 are formed in close proximity to the waveguide footprint 910. In this particular example, the masks 900,902 each consist of two stripes, one on either side of the relevant footprint 910,920. The masks preferably are $SiO_2$. Other materials, including dielectrics, nitrides and other oxides, may be used so long as the mask does not support epitaxial growth.

OMCVD is used to deposit material over the substrate. Other deposition methods, including chemical beam epitaxy, may be used in place of OMCVD. The deposited material does not grow on the masks 900,902 and instead migrates to the immediately surrounding areas, including VLSOA region 920 and waveguide region 910, respectively. This typically results in a difference in thickness of the material deposited and also in the material composition since the constituent species have different diffusion lengths. As a result, the relative concentrations of each of the constituent species varies as a function of the distance and width of the SAE masks. The magnitude of this effect depends, in part, on the size, shape and location of the SAE masks 900,902 and also on the OMCVD deposition conditions. Since the two masks 900 and 902 have different widths w, the corresponding regions 920 and 910 are affected differently and have different material compositions. In particular, the bandgaps of the two materials is selected to form the active region 504 and waveguide core 704, respectively. The following example is based on the difference in material composition caused by SAE. Approaches based on other effects, such as differences in the amount of material deposited, will be apparent.

More importantly, the composition of material deposited in VLSOA region 920 will be different than that of the material deposited in waveguide area 910 and this difference in composition is used to engineer the transition energies for the two elements. FIG. 9B is a graph of transition energy as a function of SAE mask width w. In this example, the material deposited in VLSOA region 920 will have a smaller bandgap energy than that deposited in waveguide region 910 since mask 900 is wider than mask 902. Conversely, the waveguide material 910 will have a higher bandgap energy. Assuming for this example that the transition energy is determined solely by the bandgap energy, the bandgap energy, and hence the transition energy, may be designed to be transparent at the operating wavelength and therefore suitable for a waveguide core 704; while the VLSOA material 920 retains a smaller transition energy suitable for the semiconductor active region 504. The SAE masks 900 result in the simultaneous formation of the core 704 of waveguide 710 and of the active region 504 of VLSOA 720. After this step, the remainder of waveguide 710 and VLSOA 720 is fabricated.

One advantage of the SAE approach is that it simplifies the fabrication process since both the core 704 and active region 504 are formed by a common fabrication process. In contrast, if two separate fabrication processes were used, one to form core 704 and one to form active region 504, a more complex fabrication process and possibly twice as many processing steps would be required to achieve the same result. Furthermore, the SAE approach results in a continuous layer which functions both as the waveguide core 704 and as the VLSOA active region 504. The lack of edges, abrupt material transitions and other interfaces reduces back-reflection and optical scattering which may occur at these interfaces. This is a significant advantage.

Figure 9C:
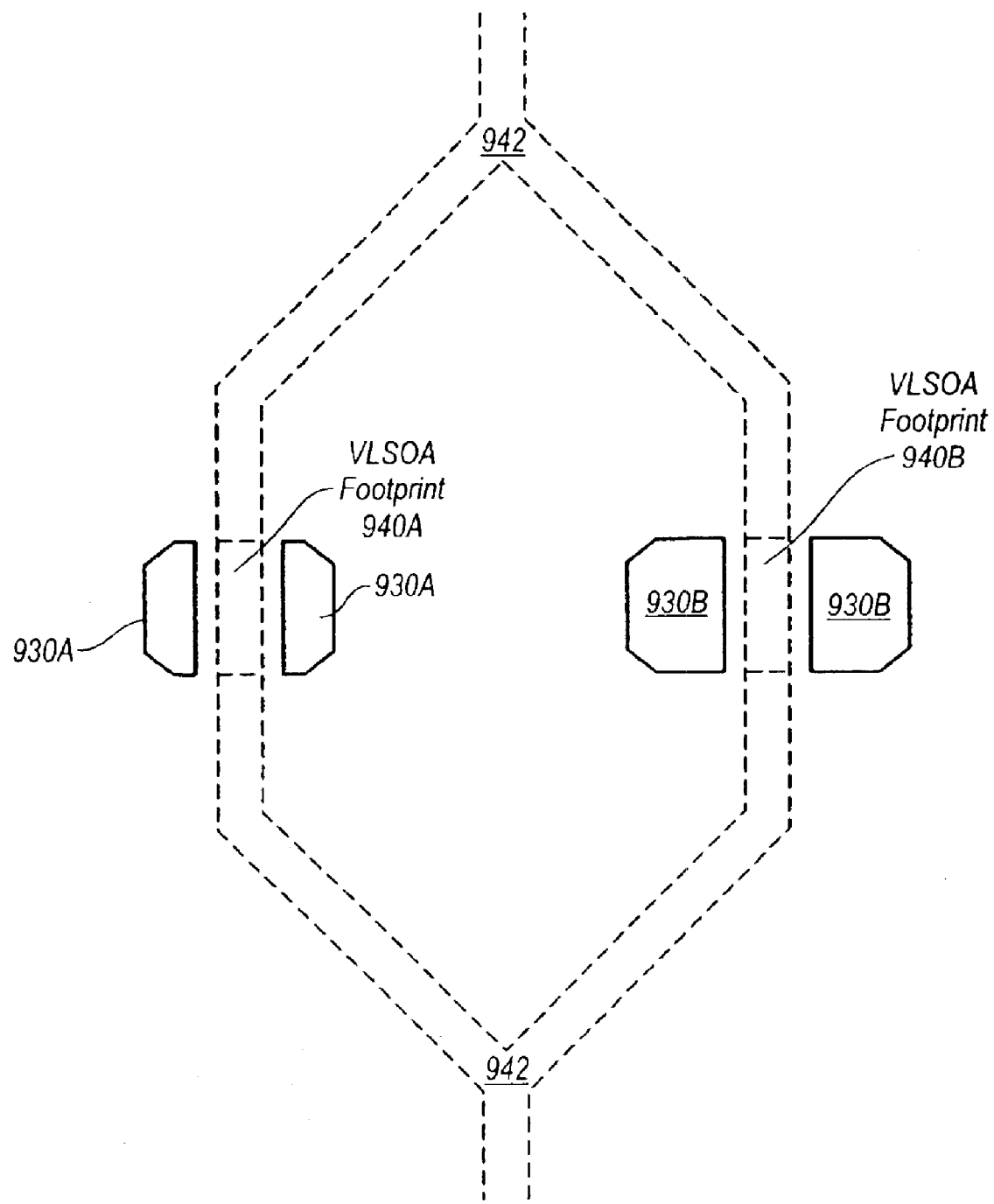
FIG. 9C is a top view of the placement of SAE masks used to fabricate integrated optical device 800.

FIG. 9C is a top view of the placement of SAE masks 930A,B used to fabricate integrated optical device 800. The dashed lines 940A, 940B and 942 show the footprints for VLSOA 820A, VLSOA 820B and waveguide structures, respectively. In this case, masks 930A and 930B are designed to result in different transition energies for the two VLSOAs 820, thus tuning them to different wavelengths. For example, mask 930B may be wider, resulting in a lower transition energy. As a result, the active region of VLSOA 820B will be tuned for a longer wavelength.

The same basic principle may be used to form active regions for different elements, such as the integrated device shown in FIG. 4D. A preferred embodiment of this device includes DBR laser sources 410, electroabsorptive modulators 414, waveguiding structure 130 and VLSOA 110. In one approach, the same basic structural layers are used to form the basis for all of these elements. This approach may also be extended to detectors in a straightforward manner, thus allowing the fabrication of the device in FIG. 4B, for example.

Fabrication begins with the formation of a bottom mirror 508 and part of a bottom cladding layer 505 on substrate 502. At this point, however, the various optical elements are distinguished from each other. The wafer is removed from the OMCVD, and DBR gratings for the DBR laser source 410 are patterned and etched into the bottom cladding layer 505, similar to what is done in a standard DBR fabrication process. The wafer is then patterned with a silicon oxide SAE mask designed to shift the transition energy of the various optical elements, such that the VLSOA 110 has the lowest transition energy, the DBR lasers 410 have intermediate transition energies (but different from laser to laser in order to achieve operation at different wavelengths), the modulators 414 have higher transition energies, and the waveguiding structure 130 has the highest transition energy making it transparent at the wavelengths of interest. OMCVD is then used to grow the rest of the structure.

Alternatively, each of the optical elements may be completed using different fabrication steps. For example, the VLSOA 110 region of the wafer can be masked off by a Nitride or oxide mask, and standard electroabsorption modulation laser buried heterostructure OMCVD growth steps used to complete the DBR laser sources 410 and modulators 414. Then, the sources 410 and modulators 414 would be masked while the VLSOA 110 was completed.

Figure 10:
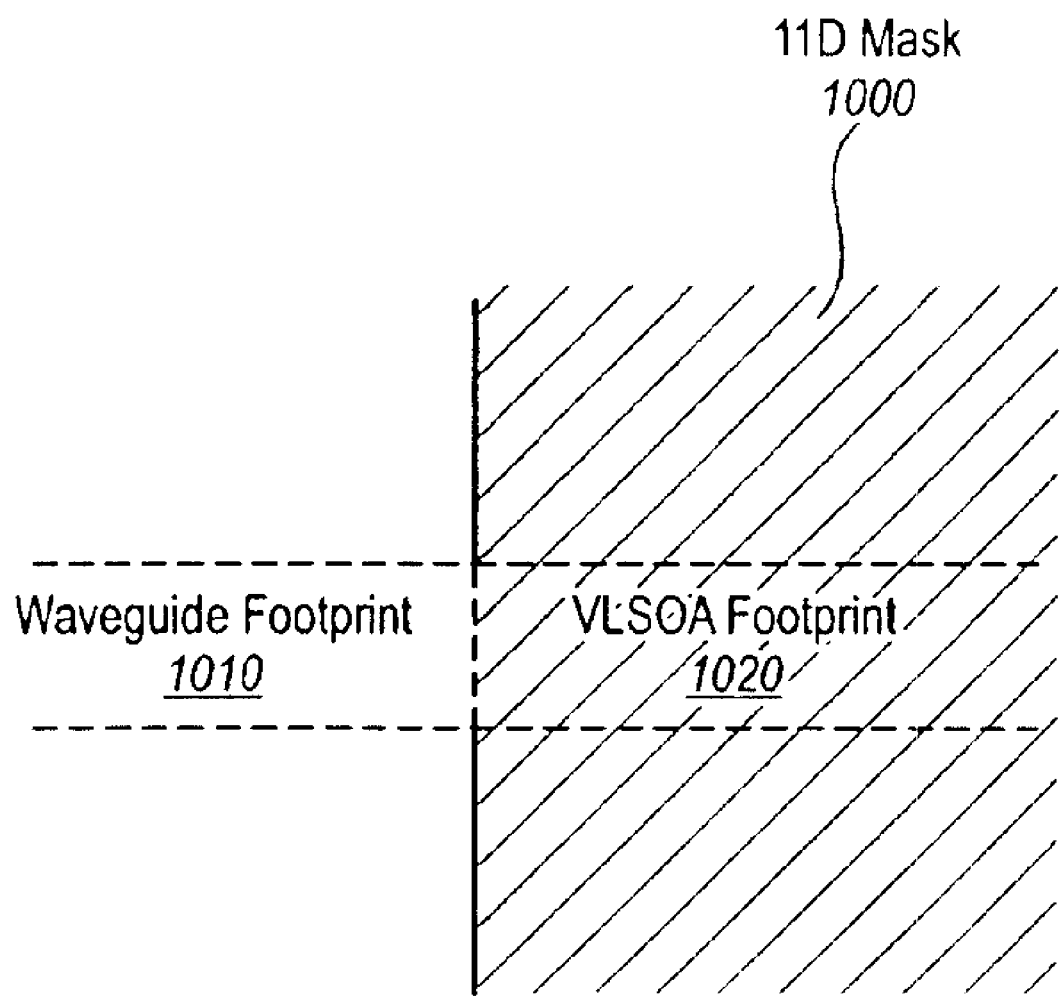
FIG. 10 is a top view of the placement of impurity induced disordering (IID) masks used to fabricate integrated optical device 700.

FIG. 10 illustrates the fabrication of integrated optical device 700 using impurity induced disordering (IID). In this approach, the transition energy difference between waveguide 710 and VLSOA 720 is created by disordering the crystal material in one of the elements. The fabrication of device 700 begins by depositing bottom cladding layers 505,705. Next, a uniform layer is grown for both the waveguide 710 and VLSOA 720. Next, a portion of this layer is masked with photoresist, dielectric, or other mask material as shown in FIG. 10. In this figure, the dashed outlines show the footprints 1010 and 1020 of waveguide 710 and VLSOA 720, respectively. IID mask 1000 is deposited to cover VLSOA 1020. The unmasked portion, in this example including waveguide footprint 1010, is implanted with silicon atoms. The device is thermally annealed. This removes any implantation damage and diffuses the silicon, causing intermixing of the thin layers of material in and around the deposited layer. Thus, the transition energy of core 704 increases since the surrounding materials have higher transition energies. If the active region 504 of VLSOA 500 is a MQW, the quantum well and barrier regions are intermixed, making the material transparent and forming core 704. If the active region 504 is a double heterostructure, higher implantation doses and annealing temperatures are preferred in order to intermix the thicker double heterostructure region and cladding layers 705 to form core 704.

In this way, the transition energy may be engineered to form core 704 of waveguide 710. The same basic approach can also be used to form other transparent structures as well as other types of active region. For example, the two VLSOAs 820 may be fabricated by using IID to tune the active region of each VLSOA 820. Other disordering methods are also applicable, including for example zinc diffusion or stress induced disordering.

Since IID results in the simultaneous formation of the core 704 and active region 504 in a common fabrication process, as was the case with SAE, the IID fabrication approach has many of the same advantages as SAE. For example, IID typically is less complex than approaches which require one fabrication process to form core 704 and a separate one to form active region 504. The IID approach also results in a continuous layer lacking edges and other abrupt interfaces, thus reducing back-reflection and optical scattering which may occur at these interfaces.

Figure 11A:
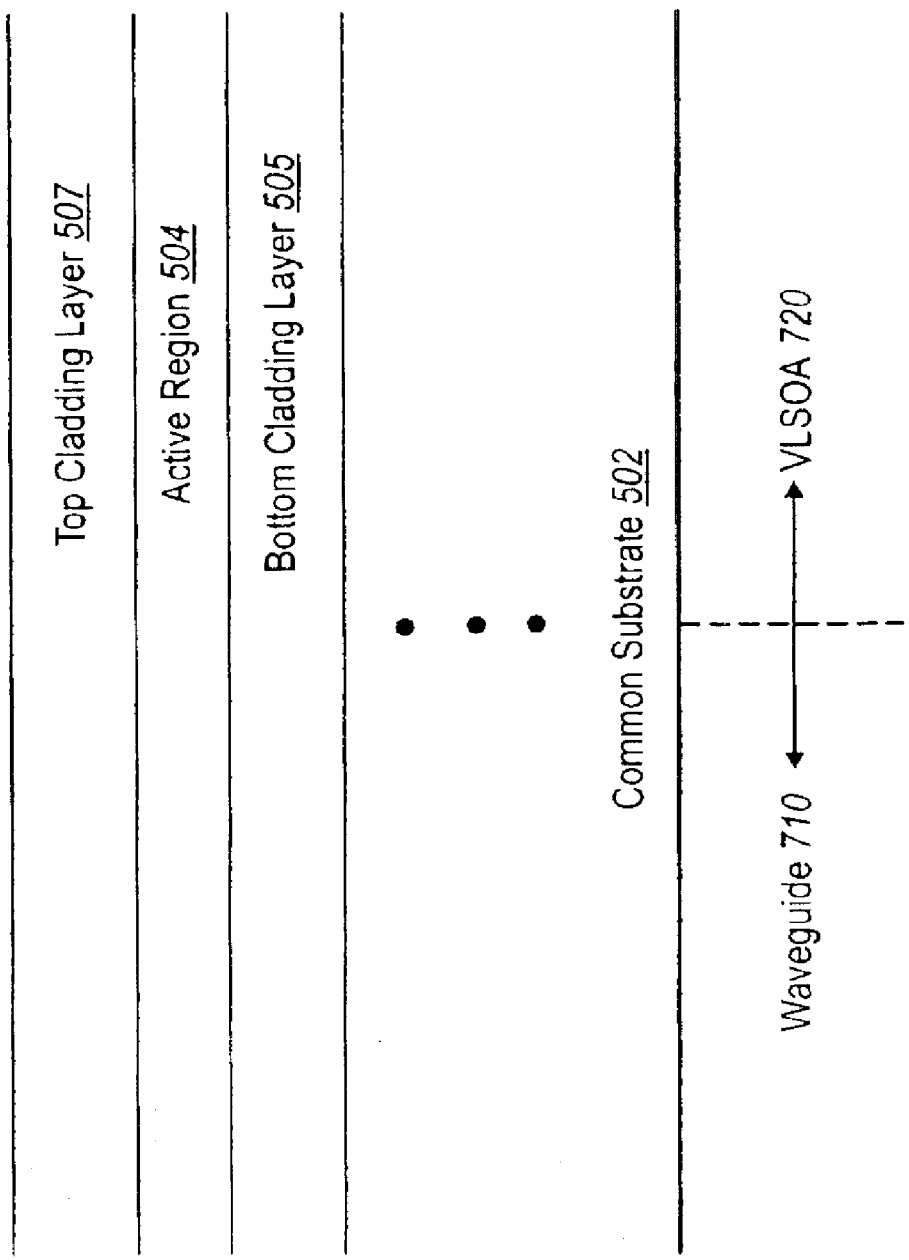
FIGS. 11A–11C are longitudinal cross-sectional views illustrating the fabrication of integrated optical device 700 using an etch and fill process.
Figure 11B:
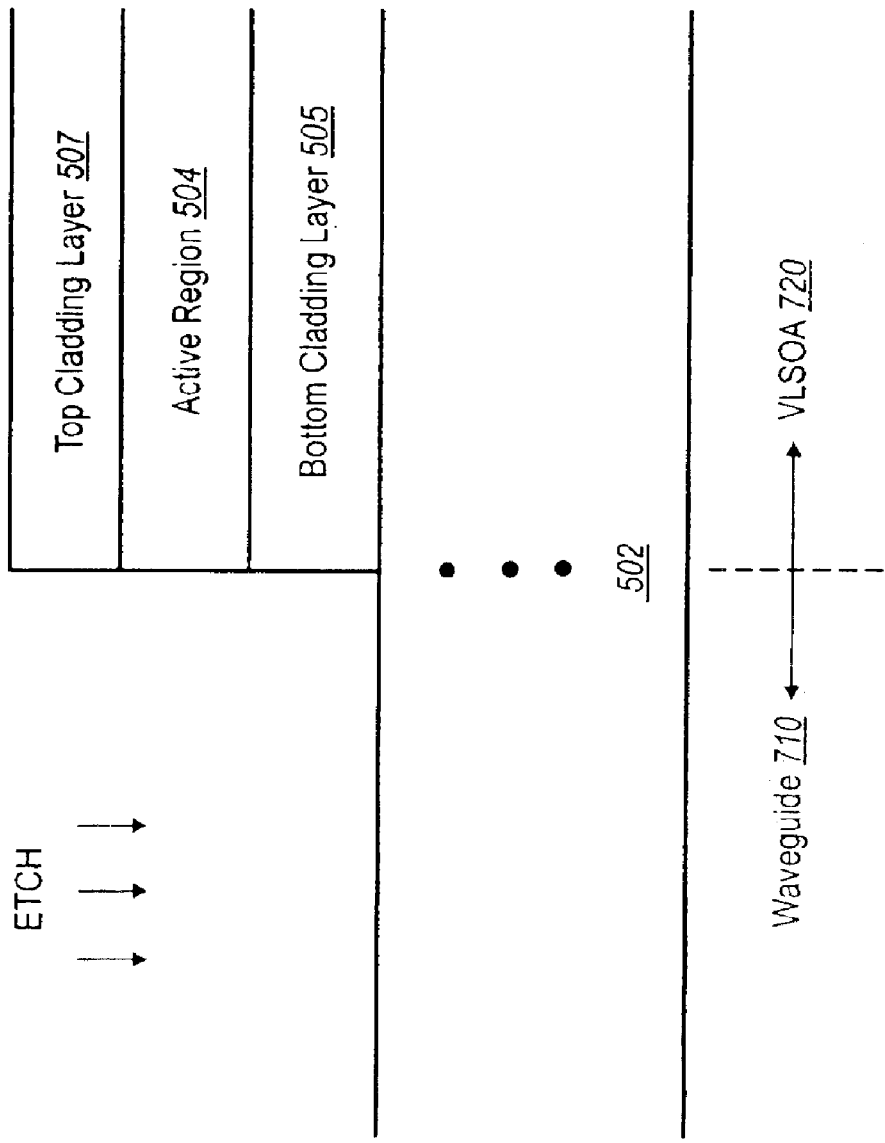
Figure 11C:
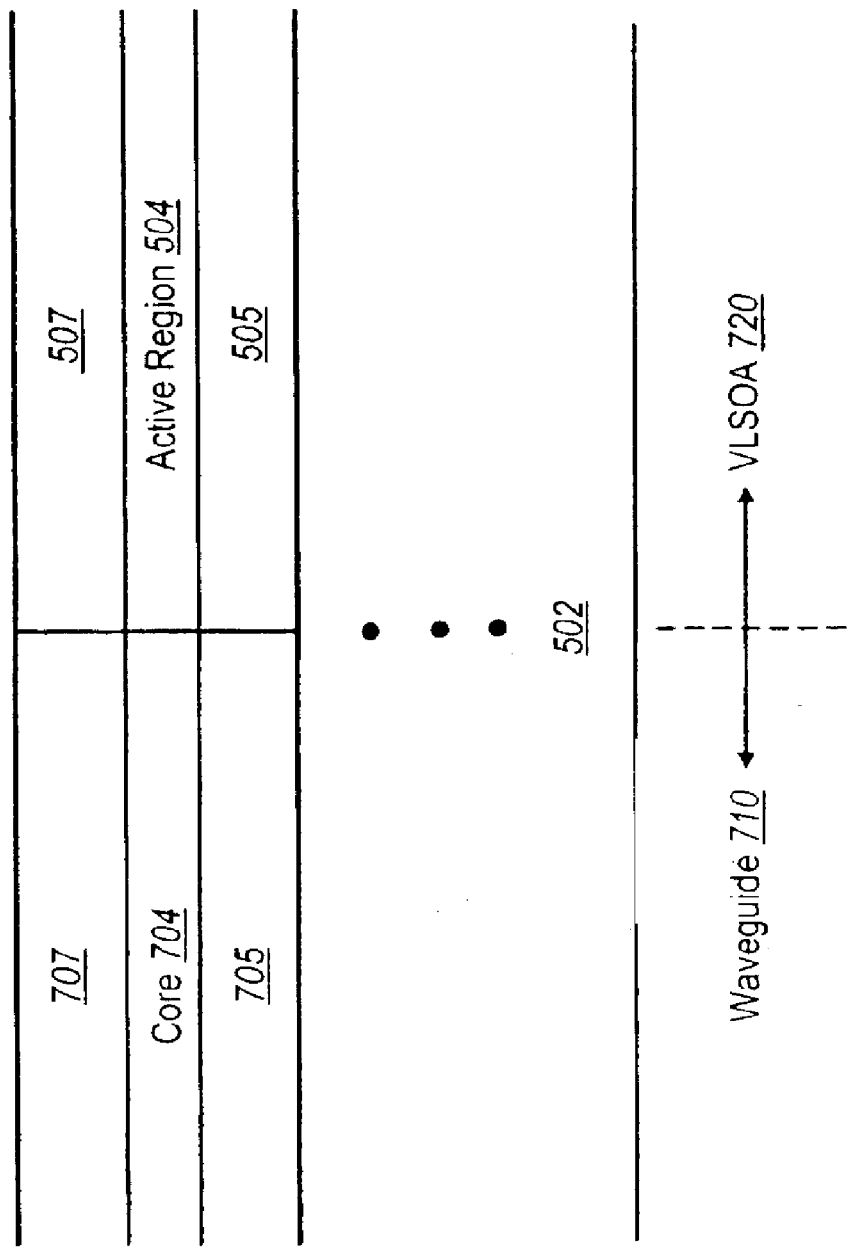

FIGS. 11A–11C are longitudinal cross sectional views illustrating the fabrication of integrated optical device 700 using an etch and fill process. Again, these are simplified views. In FIG. 11A, the device 700 has been fabricated up through the top cladding region 507. In FIG. 11B, the top cladding layer 507, active region 504, and bottom cladding layer 505 have been etched away in the regions where waveguide 710 is located, but remain in the areas where VLSOA 720 is located. In FIG. 11C, in a second fabrication process, additional material is deposited to form the bottom cladding layer 705, core 704, and top cladding layer 707 of waveguide 710. For example, the cladding layers 705,707 might be InP, and the core 704 may be InGaAlAs material with a larger transition energy than the active region 504. The remainder of the processing occurs as before.

In this example, multiple layers were etched and filled but for other devices, a single layer may be etched and filled or multiple etch and fill processes may be utilized. One advantage of etch and fill compared to SAE or IID is that there is more flexibility in choosing the materials for core 704 and active region 504 since they are deposited in two separate fabrication processes, albeit on a common substrate. For example, this technique can be used to fabricate 1.3 and 1.55 µm wavelength VLSOAs on the same substrate even though they use fairly dissimilar materials for their respective active regions. Another advantage is that this technique is insensitive to whether the active region is a DH or a MQW. Yet another advantage is that etch and fill also supports the use of dielectric materials, such as deposited silica cladding layers 705,707 with a silicon core 704.

Figure 12:
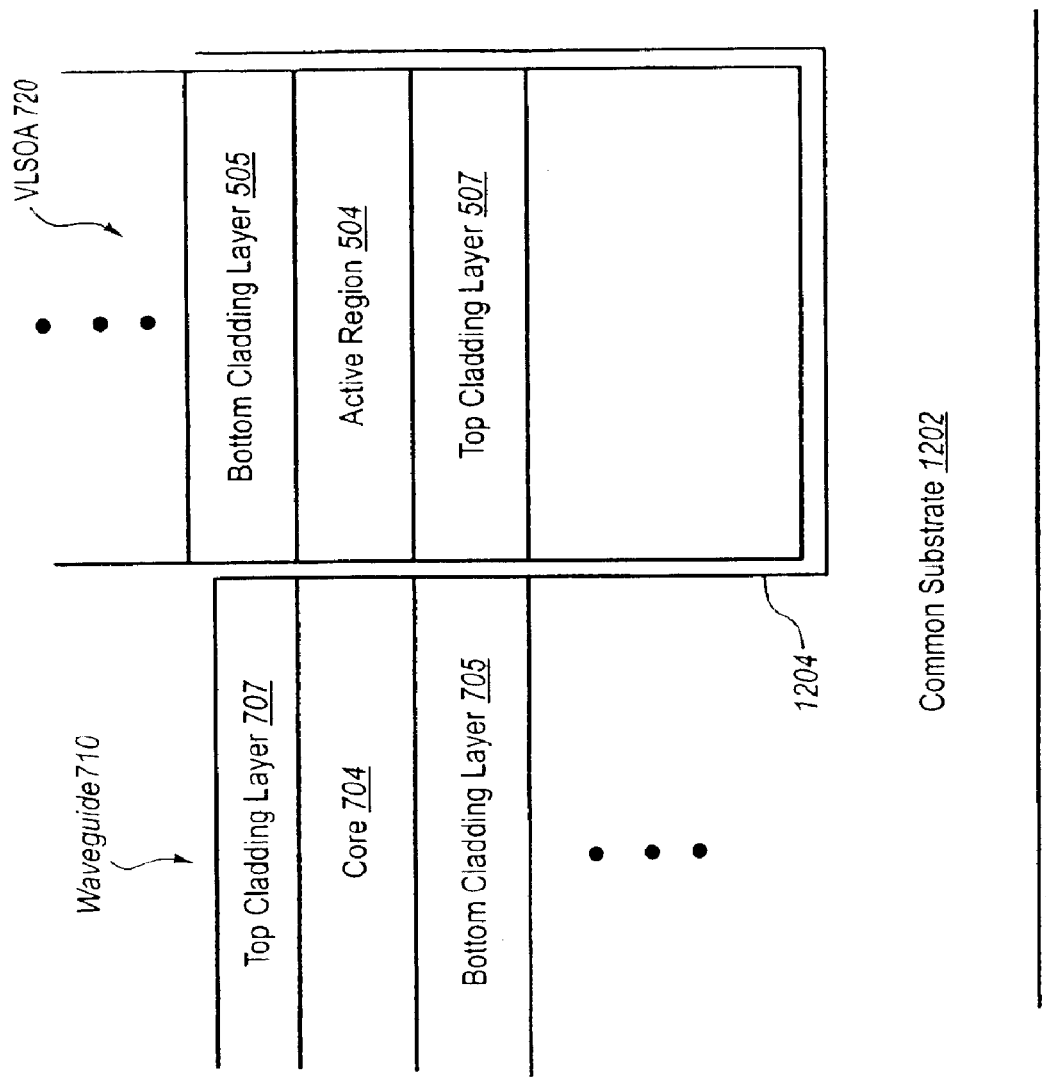
FIG. 12 is a longitudinal cross-sectional view illustrating the fabrication of integrated optical device 700 using a silicon optical bench approach.

FIG. 12 is a longitudinal cross sectional view illustrating the fabrication of device 700 using a silicon optical bench approach. This approach is also known as planar lightwave circuitry. In this example, waveguide 710 is fabricated on a first substrate 1202. In a preferred embodiment, substrate 1202 is a silicon substrate and waveguide 710 includes silica cladding layers 705,707 and a germanium or phosphorous doped silica core 704. A depression 1204 is generated in substrate for VLSOA 720. The VLSOA 720 is formed on a separate substrate using a separate fabrication process. It is then integrated onto substrate 1202. The VLSOA's original substrate may remain intact, be reduced in thickness or be removed completely during this process. In the approach shown in FIG. 12, the VLSOA 720 is turned upside down, positioned within depression 1204 so that it is properly aligned to waveguide 710 and then fixed in place with solder. This approach can be quite flexible since the optical elements (e.g., waveguide, VLSOA and other active devices) can be made using many different processes on many different substrates and then integrated onto a common substrate. For example, in the device of FIG. 4D, each DBR laser source 410—electroabsorptive modulator 414 pair may be fabricated as a single unit and the VLSOA 110 also fabricated on a separate wafer. These elements can then be dropped into place onto a silica-based planar lightwave circuit that contains an arrayed waveguide grating to function as the WDM multiplexer 130.

Although the invention has been described in considerable detail with reference to certain preferred embodiments thereof, other embodiments are possible. For example, the majority of this description focused on devices in which optical elements are integrated onto a common substrate but the integration is primarily two-dimensional. That is, the various optical elements have different x-y positions on the surface of the substrate. However, the principles described here may also be used for vertical integration, that is, when the optical elements are stacked on top of each other. The following is an example of the device of FIG. 4B in which the detector 412 is stacked on top of the VLSOA 110. This is preferred, for example, if the detector 412 is used to monitor the output laser field from the VLSOA 110. Briefly, the VLSOA of FIG. 5 is fabricated through the confinement layer 519. At this point, OMCVD is used to grow a 50 pair n-inP/InGaAs Bragg reflector, which serves as top mirror 506. OMCVD is then used to grow InGaAs n-i-p layers for the optical detector 412. During processing, separate device definition, electrical isolation, and electrical contacts are applied to allow both application of the pump current to the VLSOA 110, and detection of photocurrent in the n-i-p optical detector layers of detector 412.

As another example, FIGS. 9–12 give examples in which the transition energy of the active regions 504 of the VLSOAs and/or core regions of the waveguides are altered using various techniques. In other embodiments, other parts of the structures may be altered instead in order to produce the integrated optical devices.

Therefore, the scope of the appended claims should not be limited to the description of the preferred embodiments contained herein.

What is claimed is:

1. An integrated optical device comprising:
    a vertically lasing semiconductor optical amplifier (VLSOA) comprising:
    an amplifier input;
    an amplifier output;
    a semiconductor active region;
    an amplifying path connecting the amplifier input to the amplifier output and traversing the semiconductor active region; and
    a vertical laser cavity including the semiconductor active region; and
    an optical element, wherein a portion of the VLSOA and a portion of the optical element are formed on a common substrate by a common fabrication process and at least one parameter varies between the portion of the VLSOA and the portion of the optical element.

2. The integrated optical device of claim 1 wherein:
    the portion of the VLSOA and the portion of the optical element have different transition energies; and
    the difference in transition energies between the portion of the VLSOA and the portion of the optical element is a result of the selective area epitaxy.

3. The integrated optical device of claim 1 wherein:
    the portion of the VLSOA and the portion of the optical element have different transition energies; and
    the difference in transition energies between the portion of the VLSOA and the portion of the optical element is a result of impurity induced disordering.

4. The integrated optical device of claim 1 wherein:
    the portion of the VLSOA and the portion of the optical element have different transition energies; and
    the difference in transition energies between the portion of the VLSOA and the portion of the optical element is a result of stress-induced disordering.

5. The integrated optical device of claim 1 wherein the optical element includes a passive optical waveguide.

6. The integrated optical device of claim 5 wherein:
    the passive optical waveguide includes a core; and
    the core and the active region are formed on the common substrate by the common fabrication process but have different transition energies.

7. The integrated optical device of claim 6 wherein the difference in transition energies between the core and the active region is a result of selective area epitaxy.

8. The integrated optical device of claim 6 wherein the difference in transition energies between the core and the active region is a result of impurity induced disordering.

9. The integrated optical device of claim 6 wherein the difference in transition energies between the core and the active region is a result of stress-induced disordering.

10. The integrated optical device of claim 1 wherein the optical element includes an active optical device.

11. The integrated optical device of claim 10 wherein:
    the active optical device includes a second semiconductor active region; and
    the second semiconductor active region and the semiconductor active region of the VLSOA are formed on the common substrate by the common fabrication process but have different transition energies.

12. The integrated optical device of claim 11 wherein the difference in transition energies between the two semiconductor active regions is a result of selective area epitaxy.

13. The integrated optical device of claim 11 wherein the difference in transition energies between the two semiconductor active regions is a result of impurity induced disordering.

14. The integrated optical device of claim 11 wherein the difference in transition energies between the two semiconductor active regions is a result of stress-induced disordering.

15. The integrated optical device of claim 1 wherein:
    the optical element includes an unguided transparent region positioned to optically couple the semiconductor active region with the unguided transparent region; and
    the unguided transparent region and the semiconductor active region are formed on the common substrate by the common fabrication process.

16. An integrated optical device comprising:
    a vertically lasing semiconductor optical amplifier (VLSOA) comprising:
    an amplifier input;
    an amplifier output;
    a semiconductor active region;
    an amplifying path connecting the amplifier input to the amplifier output and traversing the semiconductor active region; and a vertical laser cavity including the semiconductor active region; and an optical element, wherein a portion of the VLSOA and a portion of the optical element are formed on a common substrate by separate fabrication processes.

17. The integrated optical device of claim 16 wherein the portion of the VLSOA and the portion of the optical clement are formed by etch and fill.

18. The integrated optical device of claim 16 wherein:

the optical element comprises a passive optical waveguide including a core, the passive optical waveguide positioned to optically couple the passive optical waveguide with the semiconductor active region; and the semiconductor active region and the core are formed on the common substrate by the separate fabrication processes.

19. The integrated optical device of claim 16 wherein:

the optical clement includes an active optical element having a second semiconductor active region positioned to optically couple the semiconductor active region of the VLSOA with the second semiconductor active region of the active optical element; and the semiconductor active region of the VLSOA and the second semiconductor active region arc formed on the common substrate by the separate fabrication processes.

20. An integrated optical device comprising:

a vertically lasing semiconductor optical amplifier (VLSOA) comprising:

an amplifier input;

an amplifier output;

a semiconductor active region;

an amplifying path connecting the amplifier input to the amplifier output and traversing the semiconductor active region; and a vertical laser cavity including the semiconductor active region; and an optical element, wherein the VLSOA and the optical element are formed on separate substrates by separate fabrication processes and integrated onto a common substrate.

21. The integrated optical device of claim 20 wherein the optical element includes a passive optical waveguide positioned to optically couple the passive optical waveguide with the semiconductor active region.

22. The integrated optical device of claim 20 wherein the optical element includes an active optical element having a second semiconductor active region positioned to optically couple tie semiconductor active region of the VLSOA with the second semiconductor active region of the active optical clement.

23. A method for making an intergrated optical device comprising:

forming a vertically lasing semiconductor optical a (VLSOA) on a substrate:

forming an optical element on the substrate:

wherein the steps of forming a VLSOA and forming an optical element comprise using a common fabrication process; and at least one parameter varies between the VLSOA and the optical element.

24. The method of claim 23 wherein the step of using a common fabrication process comprises:

placing a selective area epitaxy mask over selected areas of the substrate; and depositing material on the masked substrate, whereby the selective area epitaxy mask results in a difference between a transition energy of the material deposited on a first unmasked area of the substrate and a transition energy of the material deposited on a second unmasked area of the substrate, the VLSOA comprising the material deposited on the first unmasked area of the substrate and the optical element comprising the material deposited on the second unmasked area of the substrate.

25. The method of claim 24 wherein the selective area epitaxy mask results in a difference between a composition of the material deposited on the first unmasked area of the substrate and a composition of the material deposited on the second unmasked area of the substrate.

26. The method of claim 23 wherein the step of using a common fabrication process comprises:

placing an impurity induced disordering mask over selected areas of the substrate; and bombarding the masked substrate with impurities, whereby the impurity induced disordering mask results in a difference between a transition energy of the material underlying a masked area of the substrate and a transition energy of the material underlying an unmasked area of the substrate, the VLSOA comprising the material underlying the masked area of the substrate and the optical element comprising the material underlying the unmasked area of the substrate.

27. The method of claim 23 wherein the step of using a common fabrication process comprises:

placing an impurity induced disordering mask over selected areas of the substrate; and bombarding the masked substrate with impurities, whereby the impurity induced disordering mask results in a difference between a transition energy of the material underlying a masked area of the substrate and a transition energy of the material underlying an unmasked area of the substrate, the VLSOA comprising the material underlying the unmasked area of the substrate and the optical element comprising the material underlying the masked area of the substrate.

28. The method of claim 23 wherein the step of using a common fabrication process comprises:

using stress-induced disordering to cause a difference between a transition energy of a portion of the VLSOA and a portion of the optical element, 29. The method of claim 23 wherein:

the step of forming a VLSOA on the substrate comprises depositing a first material on the substrate; and the step of forming an optical element on the substrate comprises:

removing the first material from selected areas of the substrate; and depositing a second material on the selected areas.

30. The method of claim 23 wherein:

the step of forming an optical element on the substrate comprises depositing a first material on the substrate; and the step of forming a VLSOA on the substrate comprises:

removing the first material from selected areas of the substrate; and depositing a second material on the selected areas.

31. A method for making an integrated optical device comprising:

forming a vertically lasing semiconductor optical amplifier (VLSOA) on a first substrate;

forming an optical element on a second substrate; and integrating the VLSOA and the optical element onto a common substrate.

32. The method of claim 31 wherein the step of integrating the VLSOA and the optical element onto a common substrate comprises one step selected from the group consisting of:

integrating the VLSOA onto the second substrate; and integrating the optical element onto the first substrate.

33. The method of claim 32 wherein:

the step of forming an optical element on a second substrate comprises forming a passive optical waveguide on the second substrate; and the step of integrating the VLSOA and the optical element onto a common substrate comprises:

generating in the second substrate a depression for the VLSOA;

positioning the VLSOA within the depression to optically couple the VLSOA to the transparent optical waveguide; and fixing the VLSOA within the depression.

* * * * *

UNITED STATES PATENT AND TRADEMARK OFFICE
CERTIFICATE OF CORRECTION

PATENT NO.        : 7,110,169 B1                                     Page 1 of 3
APPLICATION NO.   : 10/014679
DATED             : September 19, 2006
INVENTOR(S)       : Walker et al.

It is certified that error appears in the above-identified patent and that said Letters Patent is hereby corrected as shown below:

Title page
Item 56, OTHER PUBLICATIONS, Line 3, before "unnumbered", change "i" to --1--

Drawings
Sheet 14, replace Fig. 5, with the figure depicted herein below, wherein the label "100" has been changed to --110--

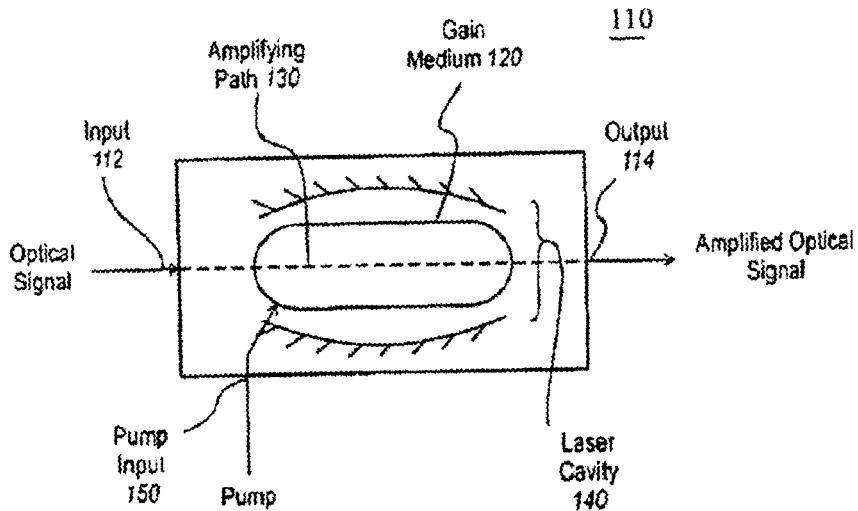

UNITED STATES PATENT AND TRADEMARK OFFICE
CERTIFICATE OF CORRECTION

PATENT NO.        : 7,110,169 B1                                Page 2 of 3
APPLICATION NO.   : 10/014679
DATED             : September 19, 2006
INVENTOR(S)       : Walker et al.

It is certified that error appears in the above-identified patent and that said Letters Patent is hereby corrected as shown below:

Drawings
Sheet 19, replace Fig. 8 with the figure depicted herein below, wherein the optical device has been labeled --800--

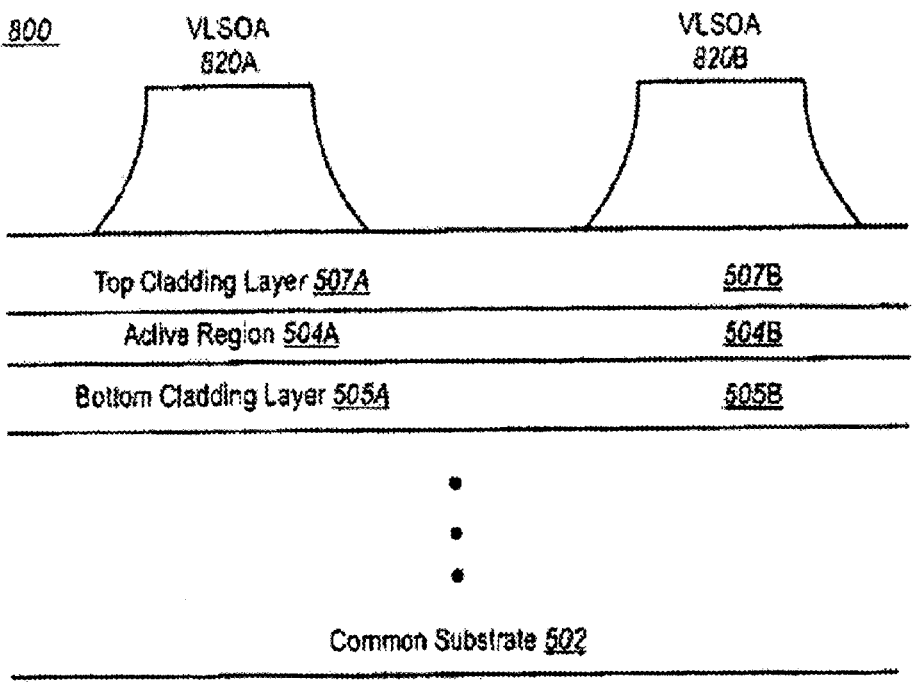

Fig.8

UNITED STATES PATENT AND TRADEMARK OFFICE
CERTIFICATE OF CORRECTION

PATENT NO. : 7,110,169 B1
APPLICATION NO. : 10/014679
DATED : September 19, 2006
INVENTOR(S) : Walker et al.

It is certified that error appears in the above-identified patent and that said Letters Patent is hereby corrected as shown below:

Column 6
Line 47, change "SOAS" to --SOAs--

Column 9
Line 67, after "devices", insert --,--

Column 20
Line 40, after "filled", insert --,--

Column 23
Line 56, after "substrate", change ":" to --;--

Signed and Sealed this

Seventeenth Day of February, 2009

JOHN DOLL
*Acting Director of the United States Patent and Trademark Office*